(12) United States Patent
Carman et al.

(10) Patent No.: US 11,778,806 B2
(45) Date of Patent: Oct. 3, 2023

(54) MEMORY DEVICE HAVING 2-TRANSISTOR VERTICAL MEMORY CELL AND SEPARATE READ AND WRITE GATES

(71) Applicant: Micron Technology, Inc., Boise, ID (US)

(72) Inventors: Eric S. Carman, San Francisco, CA (US); Durai Vishak Nirmal Ramaswamy, Boise, ID (US); Richard E Fackenthal, Carmichael, CA (US); Kamal M. Karda, Boise, ID (US); Karthik Sarpatwari, Boise, ID (US); Haitao Liu, Boise, ID (US); Duane R. Mills, Shingle Springs, CA (US); Christian Caillat, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/388,678

(22) Filed: Jul. 29, 2021

(65) Prior Publication Data

US 2023/0031904 A1 Feb. 2, 2023

(51) Int. Cl.
*G11C 11/34* (2006.01)
*H10B 12/00* (2023.01)
(Continued)

(52) U.S. Cl.
CPC .......... *H10B 12/20* (2023.02); *G11C 11/4074* (2013.01); *G11C 11/4085* (2013.01);
(Continued)

(58) Field of Classification Search
CPC ......... H01L 27/10802; H01L 27/10897; H01L 29/24; H01L 29/11519; H01L 27/11524;
(Continued)

(56) References Cited

U.S. PATENT DOCUMENTS 6,696,724 B2 * 2/2004 Verhaar ................. H01L 27/115
257/314
6,788,573 B2 * 9/2004 Choi ................. H01L 27/11521
257/315
(Continued)

FOREIGN PATENT DOCUMENTS

JP      2001093989 A  *  4/2001
WO   WO-2023009333 A1    2/2023

OTHER PUBLICATIONS

"International Application Serial No. PCT/US2022/037309, International Search Report dated Nov. 9, 2022", 3 pgs.
(Continued)

*Primary Examiner* — Viet Q Nguyen
(74) *Attorney, Agent, or Firm* — Schwegman Lundberg & Woessner, P.A.

(57) ABSTRACT

Some embodiments include apparatuses and methods of operating such apparatuses. One of such apparatuses includes a data line, a conductive region, and a memory cell including a first transistor and a second transistor. The first transistor includes a first channel region coupled to the data line and the conductive region, a charge storage structure, and a first gate. The second transistor includes a second channel region coupled to the data line and the charge storage structure, and a second gate. The first gate is electrically separated from the second gate and opposite from the second gate in a direction from the first channel region to the second channel region.

18 Claims, 14 Drawing Sheets

(51) Int. Cl.
*H01L 29/24* (2006.01)
*G11C 11/4074* (2006.01)
*G11C 11/408* (2006.01)
*G11C 11/4096* (2006.01)
*G11C 11/4094* (2006.01)
*H10B 41/10* (2023.01)
*H10B 41/27* (2023.01)
*H10B 41/35* (2023.01)
*H10B 41/40* (2023.01)

(52) U.S. Cl.
CPC ...... *G11C 11/4094* (2013.01); *G11C 11/4096* (2013.01); *H01L 29/24* (2013.01); *H10B 12/50* (2023.02); *H10B 41/10* (2023.02); *H10B 41/27* (2023.02); *H10B 41/35* (2023.02); *H10B 41/40* (2023.02)

(58) Field of Classification Search
CPC ......... H01L 27/11526; H01L 27/11556; G11C 11/4074; G11C 11/4085; G11C 11/4094; G11C 11/4096; H10B 12/20; H10B 12/50; H10B 41/10; H10B 41/35; H10B 41/40; H10B 41/27
See application file for complete search history.

(56) References Cited

U.S. PATENT DOCUMENTS

| | | | |
|---|---|---|---|
| 8,120,095 B2* | 2/2012 | Ho | H01L 27/11565 |
| | | | 257/329 |
| 8,319,274 B2* | 11/2012 | Hisamoto | H01L 29/792 |
| | | | 257/314 |
| 10,153,381 B1* | 12/2018 | Bhattacharyya | |
| | | | H01L 27/11582 |
| 10,741,658 B2* | 8/2020 | Bhattacharyya | |
| | | | H01L 27/11568 |
| 10,892,264 B2* | 1/2021 | Pulugurtha | G11C 11/4076 |
| 11,201,207 B2* | 12/2021 | Ramaswamy | H01L 28/91 |
| 11,296,094 B2* | 4/2022 | Karda | H01L 27/10897 |
| 11,335,684 B2* | 5/2022 | Karda | H01L 29/7869 |
| 2010/0329043 A1 | 12/2010 | Fossum et al. | |
| 2017/0084619 A1 | 3/2017 | Wenxu et al. | |
| 2020/0212045 A1 | 7/2020 | Karda et al. | |
| 2021/0066301 A1* | 3/2021 | Karda | H01L 27/11556 |
| 2021/0066302 A1* | 3/2021 | Karda | G11C 5/063 |

OTHER PUBLICATIONS

"International Application Serial No. PCT/US2022/037309, Written Opinion dated Nov. 9, 2022", 6 pgs.

* cited by examiner

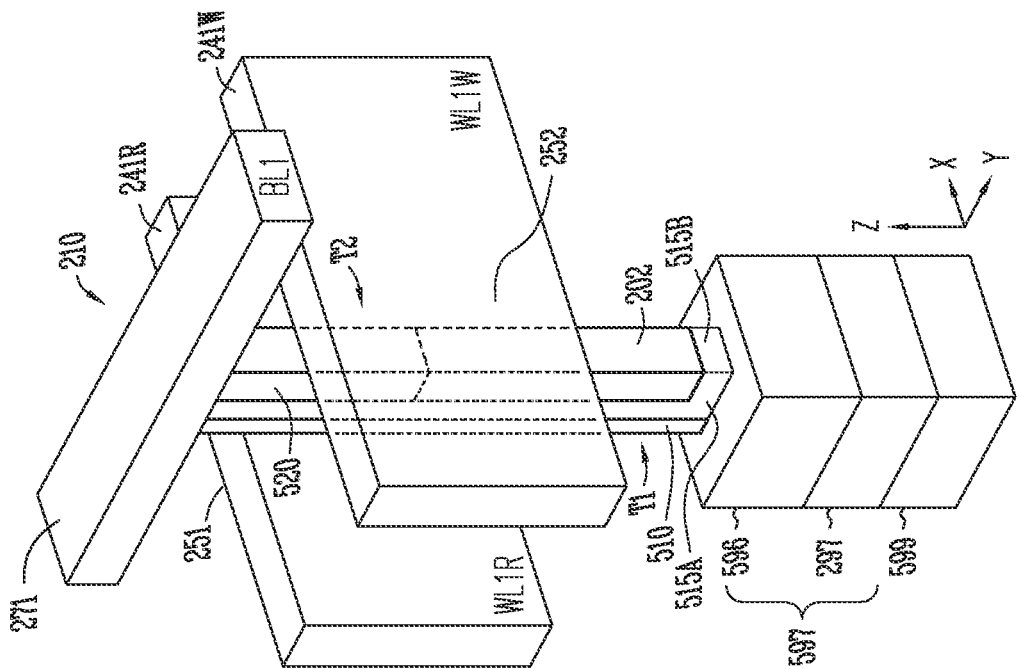
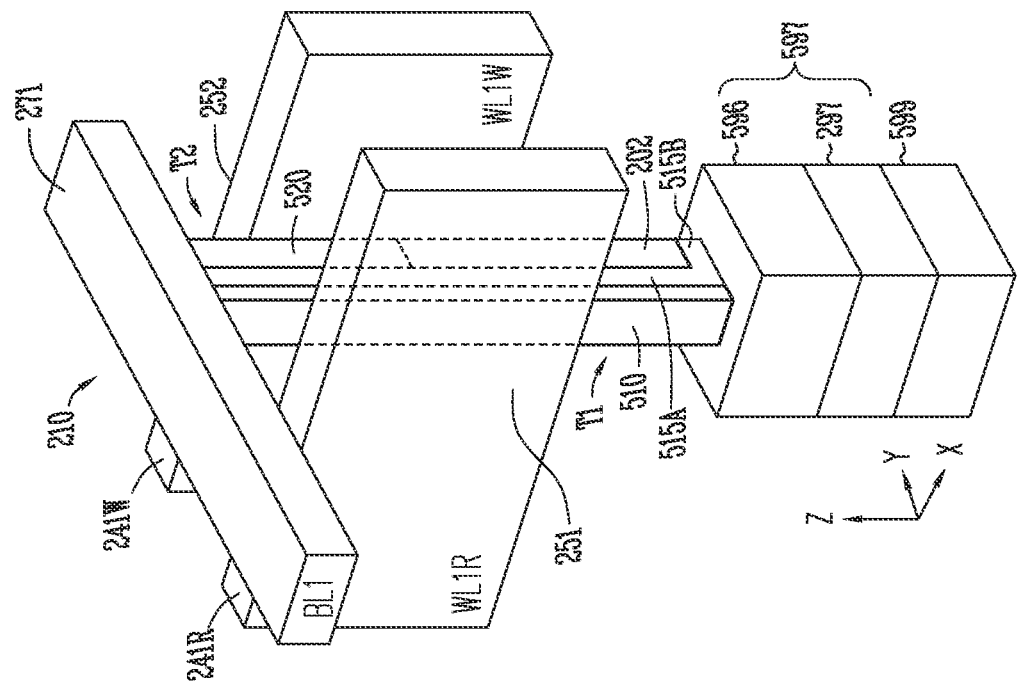

MEMORY DEVICE HAVING 2-TRANSISTOR VERTICAL MEMORY CELL AND SEPARATE READ AND WRITE GATES

BACKGROUND

Memory devices are widely used in computers and many other electronic items to store information. Memory devices are generally categorized into two types: volatile memory devices and non-volatile memory devices. A memory device usually has numerous memory cells in which to store information. In a volatile memory device, information stored in the memory cells is lost if supply power is disconnected from the memory device. In a non-volatile memory device, information stored in the memory cells is retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Further, some conventional memory devices have multiple access transistors associated with each memory cell. Some of those conventional memory devices use the same access line (e.g., the same word line) to control the multiple access transistors of the memory cell during a read or write operation. Using the same access line may place some requirements associated with the threshold voltages in the multiple access transistors in the conventional memory device. Such requirements ensure proper operations of the multiple access transistors. As described in detail below, the memory devices described herein include features that can overcome challenges faced by conventional memory devices.

BRIEF DESCRIPTION OF THE DRAWINGS

FIG. 5A through FIG. 5D show different views of a structure of the memory device of FIG. 2, according to some embodiments described herein.

DETAILED DESCRIPTION

The memory device described herein includes volatile memory cells in which each of the memory cells can include two transistors (2T). One of the two transistors has a charge storage structure, which can form a memory element of the memory cell to store information. The memory device described herein can have a structure (e.g., a 4F2 cell footprint) that allows the size of the memory device to be relatively smaller than the size of similar conventional memory devices. Further, as mentioned above, some conventional memory devices have multiple access transistors associated with each memory cell and use the same access line (e.g., same word line) to control access to the memory cell in a read or write operation. In such conventional memory devices, the access transistor (e.g., a write access transistor) for a write operation may be required to have a relatively higher threshold voltage to prevent read disturb of the memory cell during a read operation. However, structuring such a write access transistor to have a relatively higher threshold voltage may require careful structure design and material selection for the memory cell in a conventional memory device.

The memory device described herein includes separate access lines (e.g., separate word lines) to separately (e.g., independently) control respective transistors of each memory cell during a read operation or a write operation of the memory device. In comparison with some conventional techniques, using separate access lines as described herein can lessen the requirements associated with having a relatively higher threshold voltage for a write transistor in a memory cell.

Further, the arrangement of the access lines described herein can provide built-in shield structures that can protect or prevent adjacent transistors from disturbance (e.g., in adjacent channel regions of adjacent memory cells) during read and write operation of adjacent memory cells. Moreover, the arrangement of the access lines described herein can provide an opportunity to enlarge the size of a storage charge storage structure of the memory cell for improving (e.g., increasing) storage capacitance of the memory cell. Other improvements and benefits of the described memory device and its variations are discussed below with reference to FIG. 1 through FIG. 8C.

Figure 1:
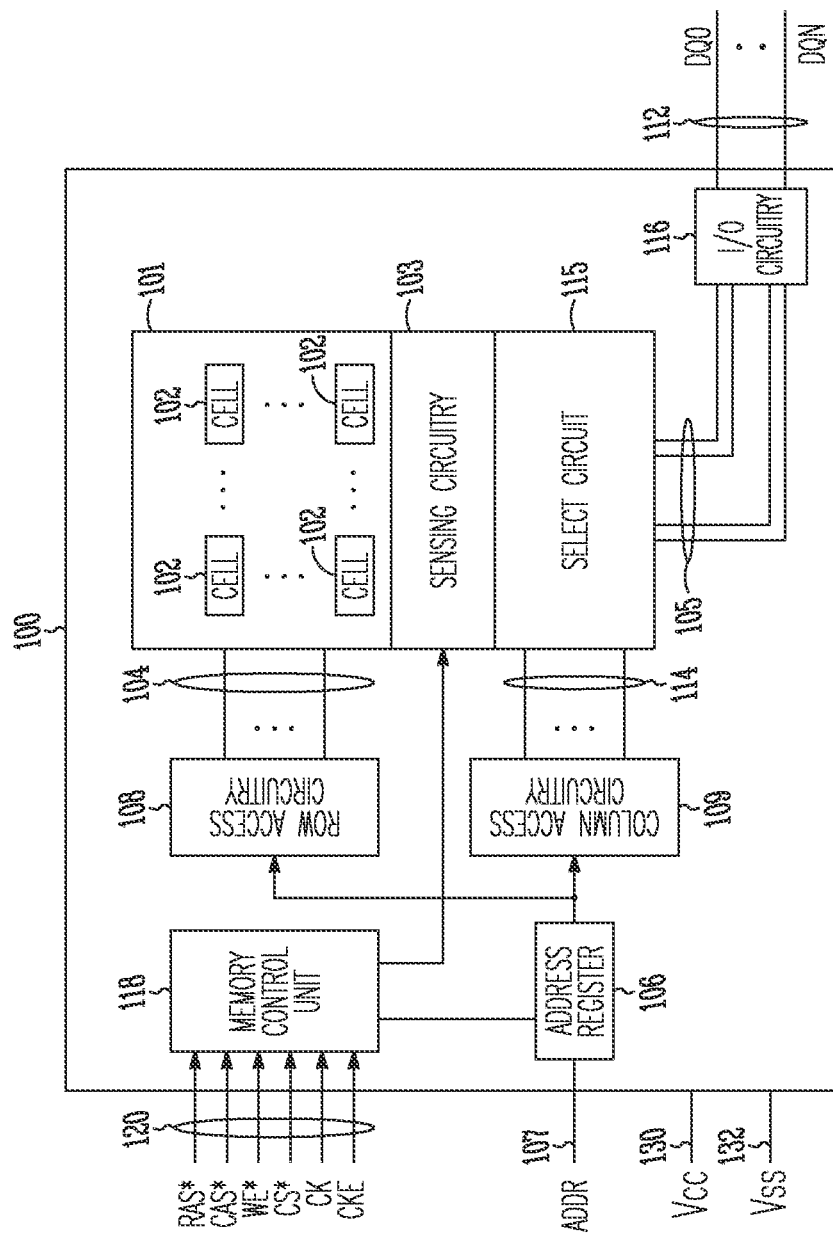
FIG. 1 shows a block diagram of an apparatus in the form of a memory device including memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 can include a volatile memory device such that memory cells 102 can be volatile memory cells. An example of memory device 100 includes a dynamic random-access memory (DRAM) device. Information stored in memory cells 102 of memory device 100 may be lost (e.g., invalid) if supply power (e.g., supply voltage Vcc) is disconnected from memory device 100. Hereinafter, supply voltage Vcc is referred to as representing some voltage levels; however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on supply voltage Vcc, such an internal voltage may be used instead of supply voltage Vcc.

In a physical structure of memory device 100, each of memory cells 102 can include transistors (e.g., two transistors) formed vertically (e.g., stacked on different layers) in different levels over a substrate (e.g., semiconductor substrate) of memory device 100. Memory device 100 can also include multiple levels (e.g., multiple decks) of memory cells where one level (e.g., one deck) of memory cells can be formed over (e.g., stacked on) another level (e.g., another deck) of additional memory cells. The structure of memory array 101, including memory cells 102, can include the structure of memory arrays and memory cells described below with reference to FIG. 2 through FIG. 8B.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or read (e.g., sensed) from memory cells 102.

Memory device 100 can include an address register 106 to receive address information ADDR (e.g., row address signals and column address signals) on lines (e.g., address lines) 107. Memory device 100 can include row access circuitry (e.g., X-decoder) 108 and column access circuitry (e.g., Y-decoder) 109 that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1")), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form of signals DQ0 through DQN) can be based on the values of the signals on data lines 105. In a write operation, the value (e.g., "0" or "1") of information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or the same as any of the memory devices described below with reference to FIG. 2 through FIG. 12C.

Figure 2:
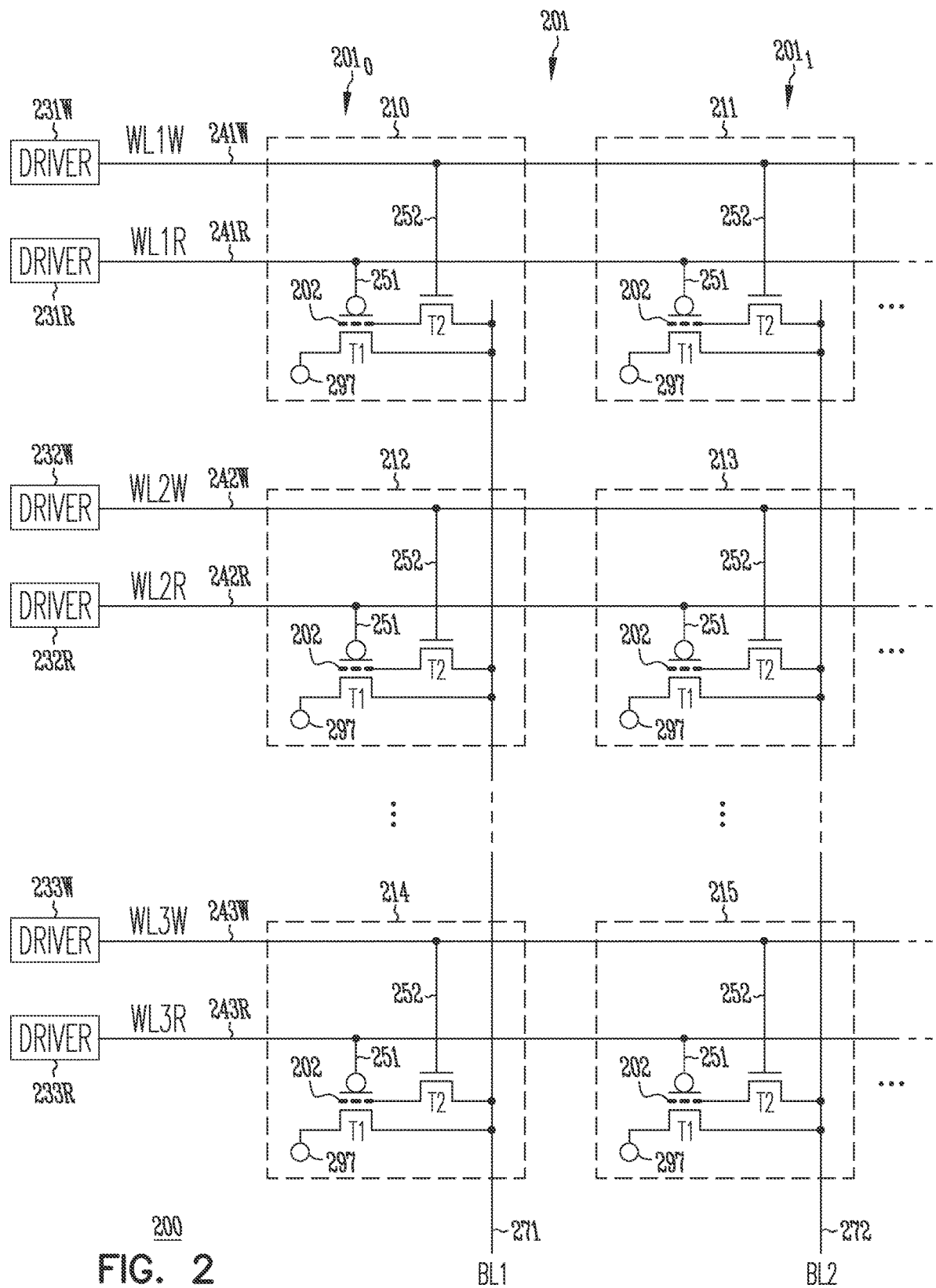
FIG. 2 shows a schematic diagram of a portion of a memory device including a memory array of two-transistor (2T) memory cells, according to some embodiments described herein.

FIG. 2 shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 215, which are volatile memory cells (e.g., DRAM cells). For simplicity, similar or the same elements among memory cells 210 through 215 are given the same labels.

Each of memory cells 210 through 215 can include two transistors T1 and T2. Thus, each of memory cells 210 through 215 can be called a 2T memory cell (e.g., 2T gain cell). Each of transistors T1 and T2 can include a field-effect transistor (FET). As an example, transistor T1 can be a p-channel FET (PFET), and transistor T2 can be an n-channel FET (NFET). Part of transistor T1 can include a structure of a p-channel metal-oxide semiconductor (PMOS) transistor FET (PFET). Thus, transistor T1 can include an operation similar to that of a PMOS transistor. Part of transistor T2 can include an n-channel metal-oxide semiconductor (NMOS). Thus, transistor T2 can include an operation similar to that of a NMOS transistor.

As shown in FIG. 2, transistor T1 can have a gate 251. Transistor T2 can have a gate 252. Gates 251 and 252 are electrically separated from each other. Transistor T1 of memory device 200 can include a charge-storage based structure (e.g., a floating-gate based). As shown in FIG. 2, each of memory cells 210 through 215 can include a charge storage structure 202, which can include the floating gate of transistor T1. Charge storage structure 202 can form the memory element of a respective memory cell among memory cells 210 through 215. Charge storage structure 202 can store charge. The value (e.g., "0" or "1") of information stored in a particular memory cell among memory cells 210 through 215 can be based on the amount of charge in charge storage structure 202 of that particular memory cell. Each of memory cells 210 through 215 can be configured to store at most one bit (e.g., a single-level cell) or multiple bits (e.g., multiple-level cell). For example, the value of information stored in each of memory cells 210 through 215 can be "0" or "1" if each memory cell is configured as a single-bit memory cell or "00", "01", "10", or "11" (or other multi-bit values) if each memory cell is configured as a multi-bit memory cell.

As shown in FIG. 2, transistor T2 (e.g., the channel region of transistor T2) of a particular memory cell among memory cells 210 through 215 can be electrically coupled to (e.g., directly coupled to) charge storage structure 202 of that particular memory cell. Thus, a circuit path (e.g., current path) can be formed directly between transistor T2 of a particular memory cell and charge storage structure 202 of that particular memory cell during an operation (e.g., a write operation) of memory device 200. During a write operation of memory device 200, a circuit path (e.g., current path) can be formed between a respective data line (e.g., data line 271 or 272) and charge storage structure 202 of a particular memory cell through transistor T2 (e.g., through the channel region of transistor T2) of the particular memory cell.

Memory cells 210 through 215 can be arranged in memory cell groups $201_0$ and $201_1$. FIG. 2 shows two memory cell groups (e.g., $201_0$ and $201_1$) as an example. However, memory device 200 can include more than two memory cell groups. Memory cell groups $201_0$ and $201_1$ can include the same number of memory cells. For example, memory cell group $201_0$ can include memory cells 210, 212, and 214, and memory cell group $201_1$ can include memory cells 211, 213, and 215. FIG. 2 shows three memory cells in each of memory cell groups $201_0$ and $201_1$ as an example. The number of memory cells in memory cell groups $201_0$ and $201_1$ can be different from three.

Memory device 200 can perform a write operation to store information in memory cells 210 through 215, and a read operation to read (e.g., sense) information from memory cells 210 through 215. Memory device 200 can be configured to operate as a DRAM device. However, unlike some conventional DRAM devices that store information in a structure such as a container for a capacitor, memory device 200 can store information in the form of charge in charge storage structure 202 (which can be a floating gate structure). As mentioned above, charge storage structure 202 can be the floating gate of transistor T1. During an operation (e.g., a read or write operation) of memory device 200, two separate access lines (e.g., read access line and write access line) and a data line (e.g., a single data line) can be used to access a selected memory cell (e.g., target memory cell).

As shown in FIG. 2, memory device 200 can include access lines (e.g., word lines) 241R, 241W, 242R, 242W, 243R, and 243W that can carry respective signals (e.g., word line signals) WL1W, WL1R, WL2W, WL2R, WL3W, and WL3R. Access lines 241R. 241W, 242R, 242W, 243R, and 243W are electrically separated from each other. Each memory cell can be associated with two access lines (e.g., read access line and write access line).

The access line (e.g., access line 241R, 242R, or 243R) having label that includes letter "R" can be called a read access line. Access lines 241R, 242R, and 243R can used to selectively turn on a respective transistor T1 (e.g., read transistor) of a selected memory cell (or selected memory cells) during a read operation to read information from the selected memory cell (or selected memory cells).

The access line (e.g., access line 241W. 242W, or 243W) having a label that includes letter "W" can be called a write access line. Access lines 241W, 242W, and 243W can used to selectively turn on a respective transistor T2 (e.g., write transistor) of a selected memory cell (or selected memory cells) during a write operation to store information in the selected memory cell (or selected memory cells).

Access lines 241R. 241W, 242R, 242W, 243R, and 243W can be used to access both memory cell groups $201_0$ and $201_1$. Each of access lines 241R, 241W, 242R. 242W, 243R, and 243W can be structured as a conductive line, which can be driven (e.g., activated) by a separate driver (described below).

Memory device 200 can include drivers 231W, 231R. 232W, 232R, 233W, and 233R coupled to access lines 241W, 241R. 242W, 242R. 243W, and 243R, respectively. Drivers 231R, 232R, and 233R can be called read drivers and can be used to selectively drive (e.g., activate) access lines 241R, 242R, and 243R, respectively, during a read operation. Drivers 231W, 232W, and 233W can be called write drivers and can be used to selectively drive (e.g., activate) access lines 241W, 242W, and 243W, respectively, during a write operation.

Drivers 231W, 231R. 232W, 232R. 233W, and 233R can be complementary metal oxide semiconductor (CMOS) drivers or other types of drivers that can operate to provide (e.g., drive) signals WL1W, WL1R, WL2W, WL2R, WL3W, and WL3R associated with access lines 241W, 241R, 242W, 242R, 243W, and 243R, respectively. Signals WL1W, WL1R, WL2W, WL2R, WL3W, and WL3R can be provided with different voltages depending on which operation (e.g., read or write operation) memory device 200 performs.

Drivers 231W, 231R. 232W, 232R. 233W, and 233R can be configured to drive access lines 241W, 241R. 242W, 242R. 243W, and 243R one at a time during an operation (e.g., read or write operation) of memory device 200 to access a selected memory cell (or selected memory cells) among memory cells 210 through 215. A selected cell can be referred to as a target cell. In a read operation, information can be read from a selected memory cell (or selected memory cells). In a write operation, information can be stored in a selected memory cell (or selected memory cells).

Each of gates 251 and 252 of respective transistors T1 and T2 can be electrically coupled to a respective access line. In the structure of memory device 200 (see FIG. 5A through FIG. 6B), each of gates 251 and 252 can be formed from a portion (e.g., portion of the material) of a respective access line among access lines 241R, 241W. 242R, 242W, 243R, and 243W. As described above, access lines (e.g., access lines 241R and 241W) associated with a memory cell (e.g., memory cell 210) are electrically separated from each other. Thus, gate 251 of transistor T1 and gate 252 of transistor T2 of a memory cell (e.g., memory cell 210) are also electrically separated from each other.

In memory device 200 of FIG. 2, gates 251 of different transistors T1 of memory cells associated with the same access line (e.g., a read access line) can be formed from different portions of the conductive material that forms that access line. Gates 252 of different transistors T2 of memory cells associated with the same access line (e.g., a write access line) can be formed from different portions of the conductive material that forms that access line For example, as shown in FIG. 2 gates 251 of respective transistors T1 of memory cells 210 and 211 can be formed from two respective portions of a conductive material (or materials) that forms access line 241R. Gates 252 of respective transistors T2 of memory cells 210 and 211 can be formed from two respective portions of a conductive material (or materials) that forms access line 241W.

Gates 251 of respective transistors T1 of memory cells 212 and 213 can be formed from two respective portions of a conductive material (or materials) that forms access line 242R. Gates 252 of respective transistors T2 of memory cells 212 and 213 can be formed from two respective portions of a conductive material (or materials) that forms access line 242W.

Gates 251 of respective transistors T1 of memory cells 214 and 215 can be formed from two respective portions of a conductive material (or materials) that forms access line 243R. Gates 252 of respective transistors T2 of memory cells 214 and 215 can be formed from two respective portions of a conductive material (or materials) that forms access line 243W.

Memory device 200 can include data lines (e.g., bit lines) 271 and 272 that can carry respective signals (e.g., bit line signals) BL1 and BL2. During a read operation, memory device 200 can use data line 271 to obtain information read (e.g., sensed) from a selected memory cell of memory cell group $201_0$, and data line 272 to read information from a selected memory cell of memory cell group $201_1$. During a write operation, memory device 200 can use data line 271 to provide information to be stored in a selected memory cell of memory cell group $201_0$, and data line 272 to provide information to be stored in a selected memory cell of memory cell group $201_1$.

Memory device 200 can include a conductive connection 297 coupled to (e.g., coupled to a terminal of transistor T1) each of memory cells 210 through 215. Conductive connection 297 can include (or can be part of) a conductive region. As an example, conductive connection 297 can include a ground connection or can be part of a ground connection. For example, conductive connection 297 can be structured from a conductive plate (e.g., a layer of conductive material). The conductive plate can be coupled to a ground terminal of memory device 200 or alternatively coupled to non-ground structure of memory device 200.

In the structure of memory device 200 (FIG. 5A through FIG. 6B), conductive connection 297 can be part of a common conductive structure (e.g., a common conductive plate) or separate conductive structures that can be formed on a level of memory device 200 that is under the memory cells (e.g., memory cells 210 through 215) of memory device 200. In this example, the elements (e.g., part of transistors T1 and T2 or the entire transistors T1 and T2) of each of the memory cells (e.g., memory cells 210 through 215) of memory device 200 can be formed (e.g., formed vertically) over the common conductive structure (e.g., a common conductive plate) and electrically coupled to the common conductive structure.

As shown in FIG. 2, transistor T1 (e.g., the channel region of transistor T1) of a particular memory cell among memory cells 210 through 215 can be electrically coupled to (e.g., directly coupled to) conductive connection 297 and electrically coupled to (e.g., directly coupled to) a respective data line (e.g., data line 271 or 272). Thus, a circuit path (e.g., current path) can be formed between a respective data line (e.g., data line 271 or 272) and conductive connection 297 through transistor T1 (e.g., through a channel region of transistor T1) of a selected memory cell during an operation (e.g., a read operation) performed on the selected memory cell.

Memory device 200 can include read paths (e.g., circuit paths). Information read from a selected memory cell during a read operation can be obtained through a read path coupled to the selected memory cell. In memory cell group $201_0$, a read path of a particular memory cell (e.g., memory cell 210, 212, or 214) can include a current path (e.g., read current path) through a channel region of transistor T1 of that particular memory cell, data line 271, and conductive connection 297. In memory cell group $201_1$, a read path of a particular memory cell (e.g., memory cell 211, 213, or 215) can include a current path (e.g., read current path) through a channel region of transistor T1 of that particular memory cell, data line 272, and conductive connection 297. In the example where transistor T1 is a PFET (e.g., a PMOS), the current in the read path (e.g., during a read operation) can include a hole conduction (e.g., hole conduction in the direction from data line 271 to conductive connection 297 through the channel region of transistor T1). Since transistor T1 can be used in a read path to read information from the respective memory cell during a read operation, transistor T1 can be called a read transistor (or read access transistor) and the channel region of transistor T1 can be called a read channel region.

Memory device 200 can include write paths (e.g., circuit paths). Information to be stored in a selected memory cell during a write operation can be provided to the selected memory cell through a write path coupled to the selected memory cell. In memory cell group $201_0$, a write path of a particular memory cell can include transistor T2 (e.g., can include a write current path through a channel region of transistor T2) of that particular memory cell and data line 271. In memory cell group $201_1$, a write path of a particular memory cell (e.g., memory cell 211, 213, or 215) can include transistor T2 (e.g., can include a write current path through a channel region of transistor T2) of that particular memory cell and data line 272. In the example where transistor T2 is an NFET (e.g., NMOS), the current in a write path (e.g., during a write operation) can include an electron conduction (e.g., electron conduction in the direction from data line 271 to charge storage structure 202) through the channel region of transistor T2. Since transistor T2 can be used in a write path to store information in a respective memory cell during a write operation, transistor T2 can be called a write transistor (or write access transistor) and the channel region of transistor T2 can be called a write channel region.

Each of transistors T1 and T2 can have a threshold voltage (Vt). Transistor T1 has a threshold voltage Vt1. Transistor T2 has a threshold voltage Vt2. The values of threshold voltages Vt1 and Vt2 can be different (unequal values). For example, the value of threshold voltage Vt2 can be greater than the value of threshold voltage Vt1.

As described above, transistors T1 and T2 of the same memory cell have respective gates 251 and 252 that are electrically separated from each other. Thus, transistors T1 and T2 of the same memory cell can be separately (e.g., individually) controlled. For example, in a memory cell, transistors T1 and T2 can be separately turned on or turned off during an operation (e.g., read or write operation). Separate drivers (among drivers 231R, 231W, 232R, 232W, 233R, and 233W) can be configured to separately turn on or turn off transistor T1 and T2. For example, during a read operation to read (e.g., sense) information stored in charge storage structure 202 of memory cell 210, transistor T1 of memory cell 210 can be turned on and transistor T2 of memory cell 210 can be turned off. Turning off transistor T2 can prevent leaking of charge (e.g., during a read operation) from charge storage structure 202 through transistor T2 of the write path during the read operation.

During a read operation of memory device 200, only one memory cell of the same memory cell group can be selected one at a time to read information from the selected memory cell. For example, memory cells 210, 212, and 214 of memory cell group $201_0$ can be selected one at a time during a read operation to read information from the selected memory cell (e.g., one of memory cells 210, 212, and 214 in this example). In another example, memory cells 211, 213, and 215 of memory cell group $201_1$ can be selected one at a time during a read operation to read information from the selected memory cell (e.g., one of memory cells 211, 213, and 215 in this example).

During a read operation, memory cells of different memory cell groups (e.g., memory cell groups $201_0$ and $201_1$) that share the same access line (e.g., access lines 241W and 241R. 242W and 242R, or 243W and 243R) can be concurrently selected (or alternatively can be sequentially selected). For example, memory cells 210 and 211 can be concurrently selected during a read operation to read (e.g., concurrently read) information from memory cells 210 and 211. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215.

The value of information read from the selected memory cell of memory cell group $201_0$ during a read operation can be determined based on the value of a current detected (e.g., sensed) from a read path (described above) that includes data line 271, transistor T1 of the selected memory cell (e.g., memory cell 210, 212, or 214), and conductive connection 297. The value of information read from the selected memory cell of memory cell group $201_1$ during a read operation can be determined based on the value of a current detected (e.g., sensed) from a read path that includes data line 272, transistor T1 of the selected memory cell (e.g., memory cell 211, 213, or 215), and conductive connection 297.

Memory device 200 can include detection circuitry (not shown) that can operate during a read operation to detect (e.g., sense) a current (e.g., current I1, not shown) on a read path that includes data line 271, and detect a current (e.g., current I2, not shown) on a read path that includes data line 272. The value of the detected current can be based on the value of information stored in the selected memory cell. For example, depending on the value of information stored in the selected memory cell of memory cell group $201_0$, the value of the detected current (e.g., the value of current I1) on data line 271 can be zero or greater than zero. Similarly, depending on the value of information stored in the selected memory cell of memory cell group $201_1$, the value of the detected current (e.g., the value of current I2) on data line 272 can be zero or greater than zero. Memory device 200 can include circuitry (not shown) to translate the value of a detected current into the value (e.g., "0", "1", or a combination of multi-bit values) of information stored in the selected memory cell.

During a write operation of memory device 200, only one memory cell of the same memory cell group can be selected at a time to store information in the selected memory cell. For example, memory cells 210, 212, and 214 of memory cell group $201_0$ can be selected one at a time during a write operation to store information in the selected memory cell (e.g., one of memory cell 210, 212, and 214 in this example). In another example, memory cells 211, 213, and 215 of memory cell group $201_1$ can be selected one at a time during a write operation to store information in the selected memory cell (e.g., one of memory cell 211, 213, and 215 in this example).

During a write operation, memory cells of different memory cell groups (e.g., memory cell groups $201_0$ and $201_1$) that share the same access line (e.g., access lines 241W and 241R, 242W and 242R, or 243W and 243R) can be concurrently selected. For example, memory cells 210 and 211 can be concurrently selected during a write operation to store (e.g., concurrently store) information in memory cells 210 and 211. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215.

Information to be stored in a selected memory cell of memory cell group $201_0$ during a write operation can be provided through a write path (described above) that includes data line 271 and transistor T2 of the selected memory cell (e.g., memory cell 210, 212, or 214). Information to be stored in a selected memory cell of memory cell group $201_1$ during a write operation can be provided through a write path (described above) that includes data line 272 and transistor T2 of the selected memory cell (e.g., memory cell 211, 213, or 215). As described above, the value (e.g., binary value) of information stored in a particular memory cell among memory cells 210 through 215 can be based on the amount of charge in charge storage structure 202 of that particular memory cell.

In a write operation, the amount of charge in charge storage structure 202 of a selected memory cell can be changed (to reflect the value of information stored in the selected memory cell) by applying a voltage on a write path that includes transistor T2 of that particular memory cell and the data line (e.g., data line 271 or 272) coupled to that particular memory cell. For example, a voltage having one value (e.g., 0V) can be applied on data line 271 (e.g., provide 0V to signal BL1) if information to be stored in a selected memory cell among memory cells 210, 212, and 214 has one value (e.g., "0"). In another example, a voltage having another value (e.g., a positive voltage) can be applied on data line 271 (e.g., provide a positive voltage to signal BL1) if information to be stored in a selected memory cell among memory cells 210, 212, and 214 has another value (e.g., "1"). Thus, information can be stored (e.g., directly stored) in charge storage structure 202 of a particular memory cell by providing the information to be stored (e.g., in the form of a voltage) on a write path (that includes transistor T2) of that particular memory cell.

Drivers 231W. 231R, 232W. 232R. 233W, and 233R can be configured to apply voltages (in the form of respective signals WL1W, WL1R, WL2W, WL2R, WL3W, and WL3R) to respective access lines 241R, 241W. 242R, 242W, 243R, and 243W in a read operation and a write operation to control (e.g., turn on or turn off) respective transistors T1 and T2. The voltages (in the form of signals BL1 and BL2) applied to data lines 271 and 272 during a read operation and a write operation can be provided by another component (not shown) of memory device 200.

Figure 3:
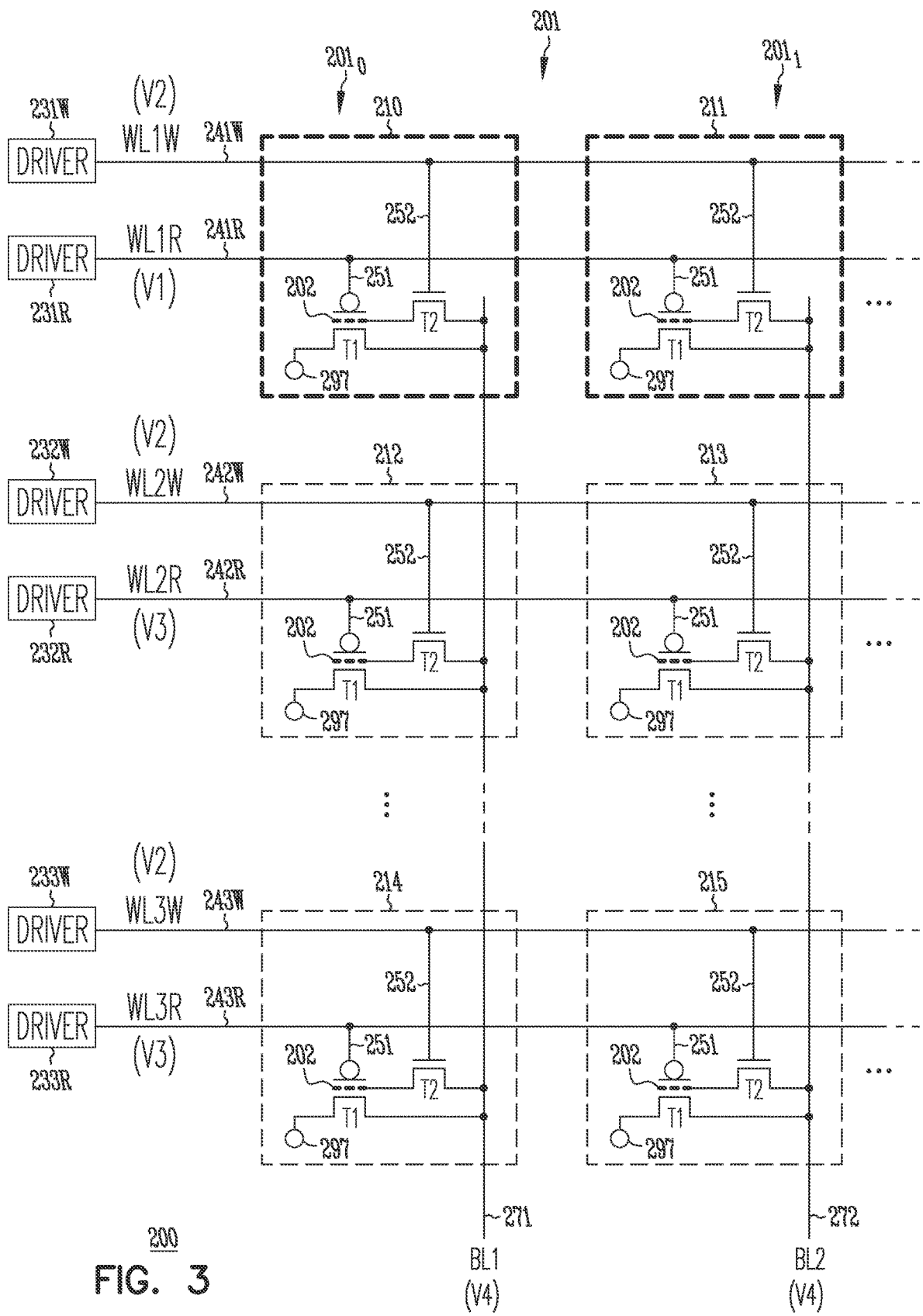
FIG. 3 shows the memory device of FIG. 2, including example voltages used during a read operation of the memory device, according to some embodiments described herein.

FIG. 3 shows memory device 200 of FIG. 2 including example voltages V1, V2, V3, and V4 used during a read operation of memory device 200, according to some embodiments described herein. The example of FIG. 3 assumes that memory cells 210 and 211 are selected memory cells (e.g., target memory cells) during a read operation to read (e.g., to sense) information stored (e.g., previously stored) in memory cells 210 and 211. Memory cells 212 through 215 are assumed to be unselected memory cells. This means that memory cells 212 through 215 are not accessed, and information stored in memory cells 212 through 215 is not read while information is read from memory cells 210 and 211 in the example of FIG. 3.

In FIG. 3, voltages V1. V2, and V3 represent different voltages applied by respective drivers (among drivers 231W, 231R. 232W, 232R, 233W, and 233R) to respective access lines 241W, 241R. 242W, 242R, 243W, and 243R during a read operation of memory device 200. Voltage V4 represents the voltage applied to each of data lines 271 and 272 during the read operation. In the read operation, conductive connection 297 can be provided with 0V (e.g., coupled to ground).

In the read operation shown in FIG. 3, voltage V1 can have a value (e.g., −1V) to turn on transistor T1 of each of memory cells 210 and 211 (selected memory cells in this example). The specific values of voltages used in this description (e.g., used in a read or write operation) are only example values. Different values may be used. For example, voltage V1 can have a negative value range (e.g., the value of voltage V1 can be from −3V to −1V).

In the read operation associated with FIG. 3, voltage V2 can have a value (e.g., 0V) to turn off (or keep off) transistor T2 of each of memory cells 210 through 215. This allows information to be read from memory cells 210 and 211. Voltage V3 can have a value (e.g., 2V), such that transistors T1 each of memory cells 212 through 215 (unselected memory cells in this example) are turned off (e.g., kept off). Voltage V4 can have a value (e.g., 0.5V), such that a current (e.g., read current) may be formed on a read path that includes data line 271, transistor T1 of memory cell 210, and conductive connection 297, and a current can be formed on a read path (a separate read path) that includes data line 272, transistor T1 of memory cell 211, and conductive connection 297. This allows a detection of current on the read paths coupled to memory cells 210 and 211, respectively. A detection circuitry (not shown) of memory device 200 can operate to translate the value of the detected current (during reading of information from the selected memory cells) into the value (e.g., "0", "1", or a combination of multi-bit values) of information read from the selected memory cell. In the example of FIG. 3, the value of the detected currents on data lines 271 and 272 can be translated into the values of information read from memory cells 210 and 211, respectively.

In the read operation shown in FIG. 3, the voltages (e.g., V2 and V3) applied to respective access lines 241W. 242R, 242W, 243R, and 243W can cause transistors T1 and T2 of each of memory cells 210 through 215, except transistor T1 of each of memory cells 210 and 211 (selected memory cells), to turn off (or to remain turned off). Transistor T1 of memory cell 210 (selected memory cell) may or may not turn on, depending on the value of the threshold voltage Vt1 of transistor T1 of memory cell 210. Transistor T1 of memory cell 211 (selected memory cell) may or may not turn on, depending on the value of the threshold voltage Vt1 of transistor T1 of memory cell 211. For example, if transistor T1 of each of memory cells (e.g., 210 through 215) of memory device 200 is configured (e.g., structured) such that the threshold voltage of transistor T1 is less than zero (e.g., Vt1<−1V) regardless of the value (e.g., the state) of information stored in a respective memory cell 210, then transistor T1 of memory cell 210, in this example, can turn on and conduct a current on data line 271 (through transistor T1 of memory cell 210). In this example, transistor T1 of memory cell 211 can also turn on and conduct a current on data line 272 (through transistor T1 of memory cell 211). Memory device 200 can determine the value of information stored in memory cells 210 and 211 based on the value of the currents on data lines 271 and 272, respectively. As described above, memory device 200 can include detection circuitry to measure the value of currents on data lines 271 and 272 during a read operation.

Figure 4:
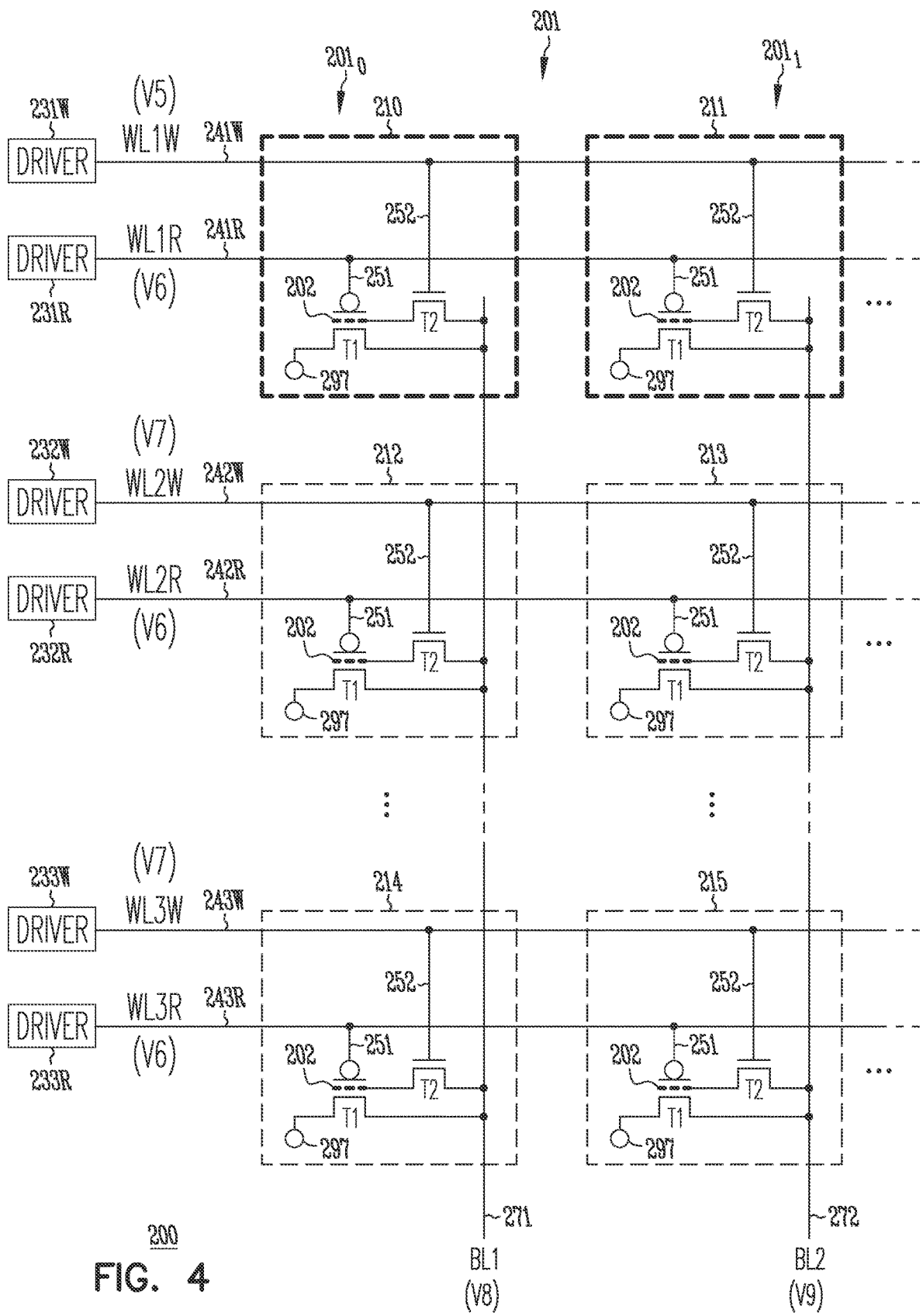
FIG. 4 shows the memory device of FIG. 2, including example voltages used during a write operation of the memory device, according to some embodiments described herein.

FIG. 4 shows memory device 200 of FIG. 2 including example voltages V5, V6. V7, V8, and V9 used during a write operation of memory device 200, according to some embodiments described herein. The example of FIG. 4 assumes that memory cells 210 and 211 are selected memory cells (e.g., target memory cells) during a write operation to store information in memory cells 210 and 211. Memory cells 212 through 215 are assumed to be unselected memory cells. This means that memory cells 212 through 215 are not accessed and information is not to be stored in memory cells 212 through 215 while information is stored in memory cells 210 and 211 in the example of FIG. 4.

In FIG. 4, voltages V5. V6, and V7 represent different voltages applied by respective drivers (among drivers 231W, 231R. 232W, 232R, 233W, and 233R) to respective access lines 241W, 241R. 242W, 242R, 243W, and 243R during a write operation of memory device 200. Voltages V8 and V9 represent the voltages applied to data lines 271 and 272, respectively, during the write operation. In the write operation, conductive connection 297 can be provided with 0V (e.g., coupled to ground).

The values of voltages V8 and V9 can be the same or different depending on the value (e.g., "0" or "1") of information to be stored in memory cells 210 and 211. For example, the values of voltages V8 and V9 can be the same (e.g., V8=V9) if the memory cells 210 and 211 are to store information having the same value. As an example, V8=V9=0V if information to be stored in each of memory cells 210 and 211 is "0", and V8=V9=1V to 3V if information to be stored in each of memory cells 210 and 211 is "1".

In another example, the values of voltages V8 and V9 can be different (e.g., V8≠V9) if the memory cells 210 and 211 are to store information having different values. As an example, V8=0V and V9=1V to 3V if "0" is to be stored in memory cell 210 and "1" is to be stored in memory cell 211. As another example, V8=1V to 3V and V9=0V if "1" is to be stored in memory cell 210 and "0" is to be stored in memory cell 211.

The range of voltage of 1V to 3V is used here as an example. A different range of voltages can be used. Further, instead of applying 0V (e.g., V8=0V or V9=0V) to a particular write data line (e.g., data line 271 or 272) for storing information having a value of "0" to the memory cell (e.g., memory cell 210 or 211) coupled to that particular write data line, a positive voltage (e.g., V8>0V or V9>0V) may be applied to that particular data line.

In the write operation shown in FIG. 4, the voltages (e.g., V6 and V7) applied to respective access lines 241R, 242R, 242W, 243R, and 243W can cause transistors T1 and T2 of each of memory cells 210 through 215, except transistor T1 of each of memory cells 210 and 211 (selected memory cells), to turn off (or to remain turned off). For example, in a write operation, voltage V6 can have a value (e.g., 2V), such that transistor T1 each of memory cells 210 through 215 are turned off (e.g., kept off). Voltage V7 can have a value (e.g., 0V), such that transistor T2 each of memory cells 212 through 215 are turned off (e.g., kept off).

Voltage V5 can have a value (e.g., 3V) to turn on transistor T2 of each of memory cells 210 and 211 (selected memory cells in this example) and form a write path between charge storage structure 202 of memory cell 210 and data line 271, and a write path between charge storage structure 202 of memory cell 211 and data line 272. A current (e.g., write current) may be formed between charge storage structure 202 of memory cell 210 (selected memory cell) and data line 271. This current can affect (e.g., change) the amount of charge on charge storage structure 202 of memory cell 210 to reflect the value of information to be stored in memory cell 210. A current (e.g., another write current) may be formed between charge storage structure 202 of memory cell 211 (selected memory cell) and data line 272. This current can affect (e.g., change) the amount of charge on charge storage structure 202 of memory cell 211 to reflect the value of information to be stored in memory cell 211.

In the example write operation of FIG. 4, the value of voltage V8 may cause charge storage structure 202 of memory cell 210 to discharge or to be charged, such that the resulting charge (e.g., charge remaining after the discharge or charge action) on charge storage structure 202 of memory cell 210 can reflect the value of information stored in memory cell 210. Similarly, the value of voltage V9 in this example may cause charge storage structure 202 of memory cell 211 to discharge or to be charged, such that the resulting charge (e.g., charge remaining after the discharge or charge action) on charge storage structure 202 of memory cell 211 can reflect the value of information stored in memory cell 211.

Thus, as described above in the example read and write operations, drivers 231W, 231R, 232W, 232R, 233W, and 233R can be configured to apply different voltages (in the form of respective signals WL1W, WL1R, WL2W, WL2R, WL3W, and WL3R) to respective access lines 241W, 241R, 242W, 242R, 243W, and 243R to selectively turn on or turn off transistors T1 and T2 of memory cells 210 through 215 in a read or write operation. For example, driver 231R can be configured to turn on transistor T1 of memory cell 210 during a read operation of reading information from memory cell 210, and to turn off transistor T1 of memory cell 210 during a write operation of storing information in memory cell 210. Driver 231W can be configured to turn off transistor T2 of memory cell 210 during a read operation of reading information from memory cell 210, and to turn on transistor T2 of memory cell 210 during a write operation of storing information in memory cell 210.

Other pairs of drivers (e.g., drivers 232R and 232W, and drivers 233R and 233W) of memory device 200 can be configured to turn on or turn off respective transistors T1 and T2 of memory cells 212 through 215 in ways similar to those of drivers 231R and 231W. For example, driver 232R can be configured to turn on transistor T1 of memory cell 212 during a read operation of reading information from memory cell 212, and to turn off transistor T1 of memory cell 212 during a write operation of storing information in memory cell 212. Driver 232W can be configured to turn off transistor T2 of memory cell 212 during a read operation of reading information from memory cell 212, and to turn on transistor T2 of memory cell 212 during a write operation of storing information in memory cell 212. In another example, driver 233R can be configured to turn on transistor T1 of memory cell 214 during a read operation of reading information from memory cell 214, and to turn off transistor T1 of memory cell 214 during a write operation of storing information in memory cell 214. Driver 233W can be configured to turn off transistor T2 of memory cell 214 during a read operation of reading information from memory cell 214, and to turn on transistor T2 of memory cell 214 during a write operation of storing information in memory cell 214.

Figure 5C:
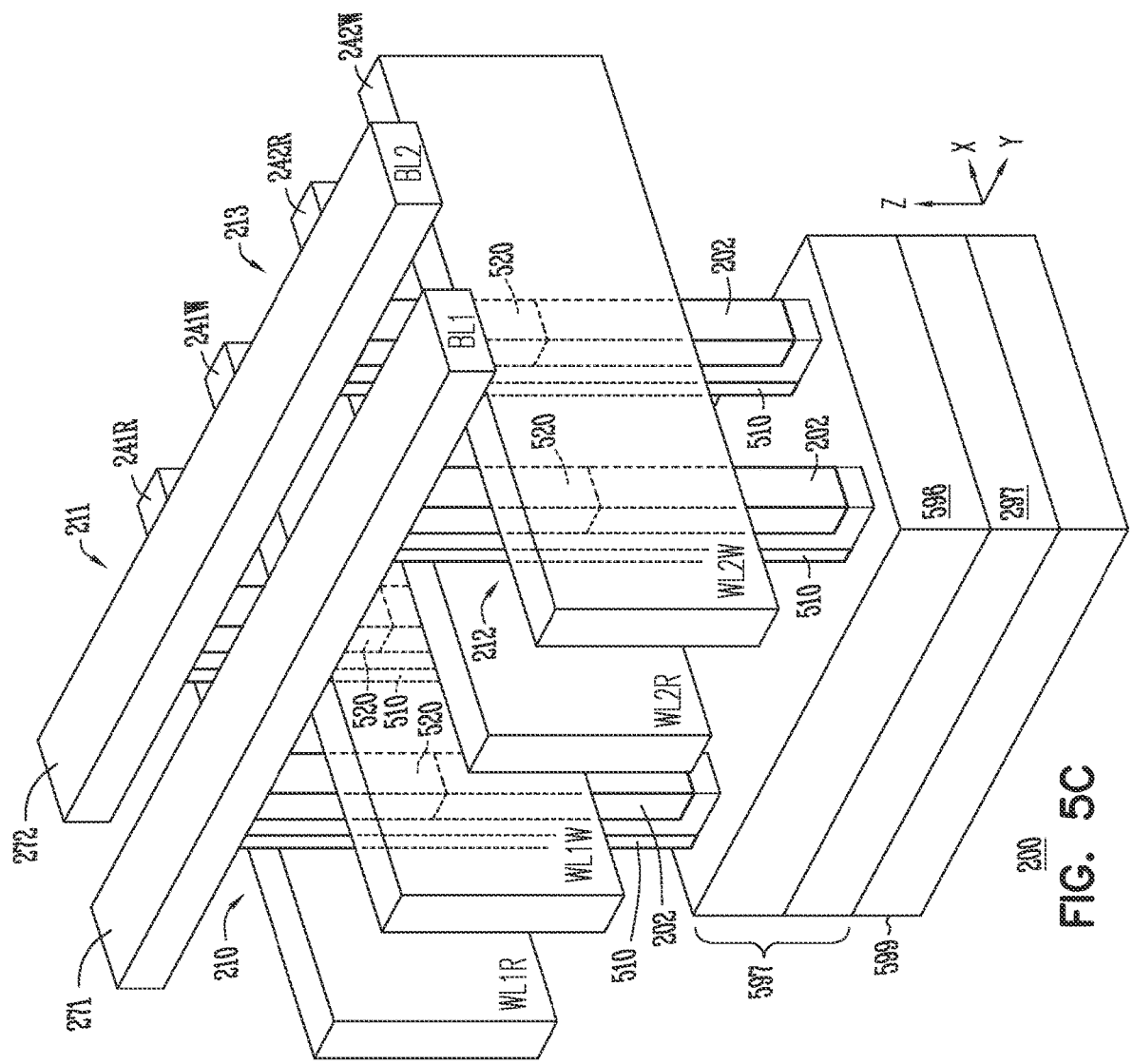
Figure 5D:
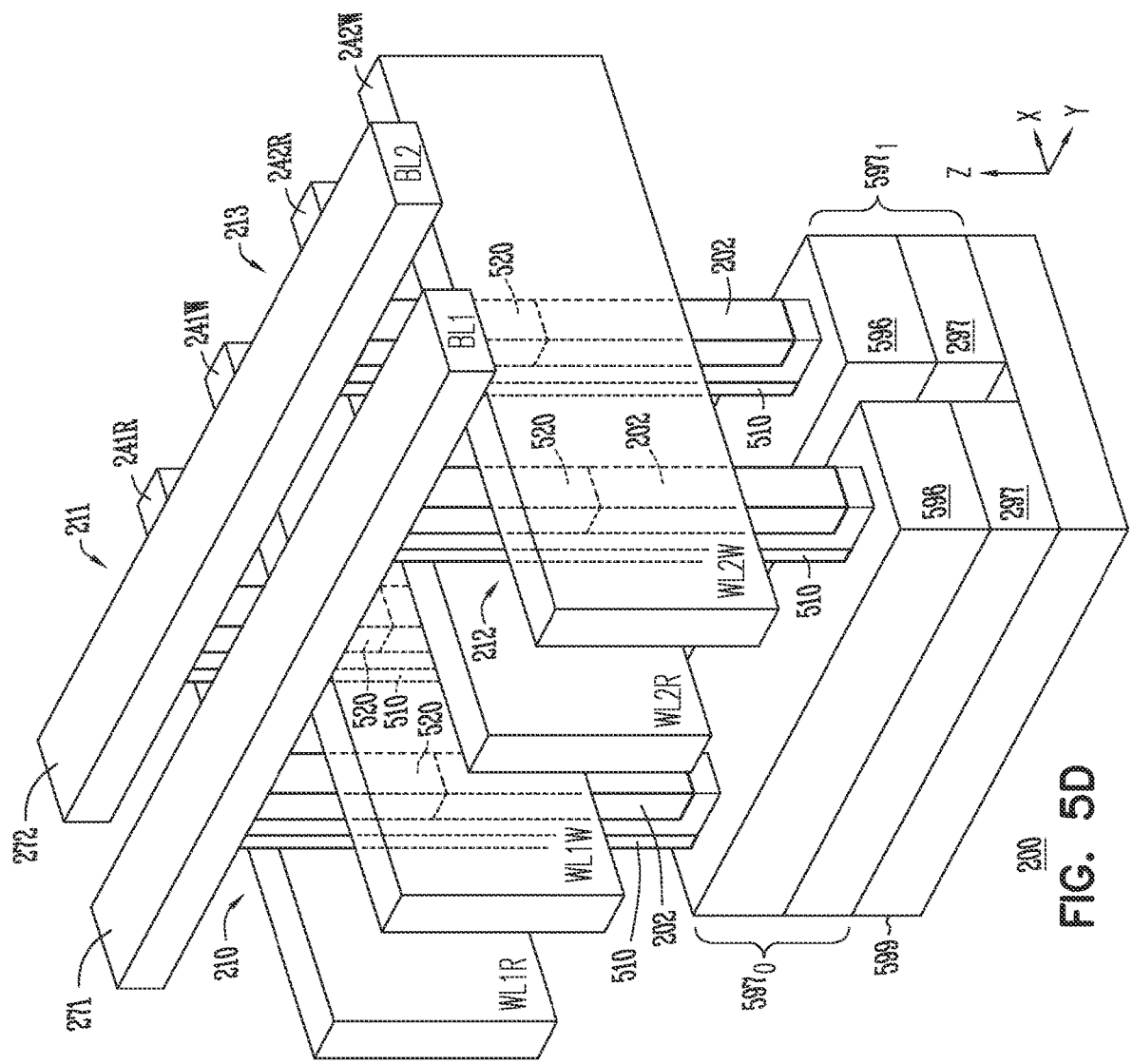

FIG. 5A, FIG. 5B. FIG. 5C, FIG. 5D show different views of a structure of memory device 200 of FIG. 2 with respect to the X, Y, and Z directions, according to some embodiments described herein. For simplicity, cross-sectional lines (e.g., hatch lines) are omitted from most of the elements shown in FIG. 5A through FIG. 5D and other figures in the drawings described herein. Some elements of memory device 200 (and other memory devices described herein) may be omitted from a particular figure of the drawings so as to not obscure the description of the element (or elements) being described in that particular figure. The dimensions (e.g., physical structures) of the elements shown in the drawings described herein are not scaled.

FIG. 5A and FIG. 5B show different 3-dimensional views (e.g., isometric views) of memory device 200 including a single memory cell (memory cell 210) with respect to the X, Y, and Z directions. FIG. 5C shows memory device 200 including multiple memory cells (memory cells 210, 211, 212, and 213). FIG. 5D shows memory device 200 of FIG. 5C including separate conductive regions $597_0$ and $597_1$.

The following description describes a portion of memory device 200 including detailed structure of memory cell 210. The structures of other memory cells (e.g., memory cells 211, 212, and 213 in FIG. 5C and other memory cells schematically shown in FIG. 2) of memory device 200 can be similar to or the same as the structure of memory cell 210. In FIG. 2 and FIG. 5A through FIG. 5D, the same elements are given the same reference numbers. Some portions (e.g., gate oxide and dielectric isolation structures) of memory device 200 are omitted from FIG. 5A through FIG. 5D so as to not obscure the elements of memory device 200 in the embodiments described herein.

As shown in FIG. 5A and FIG. 5B, memory device 200 can include a substrate 599 over which memory cell 210 of memory device 200 can be formed. Transistors T1 and T2 of memory cell 210 can be formed vertically with respect to substrate 599. Substrate 599 can be a semiconductor substrate (e.g., silicon-based substrate) or other type of substrate. As shown in FIG. 5A and FIG. 5B, the Z-direction (e.g., vertical direction) is a direction perpendicular to (e.g., outward from) substrate 599. The Z-direction is also perpendicular to (e.g., extended vertically from) the X-direction and the Y-direction (perpendicular to the X-Y plane). The X-direction and Y-direction are perpendicular to each other.

As shown in FIG. 5A and FIG. 5B, conductive connection 297 can include a structure (e.g., a piece (e.g., a layer)) of conductive material (e.g., conductive region) located over (formed over) substrate 599. Example materials for conductive connection 297 include metal, conductively doped polysilicon, or other conductive materials. Conductive connection 297 can be coupled to a ground terminal (not shown) of memory device 200. FIG. 5A and FIG. 5B show conductive connection 297 contacting (e.g., directly coupled to) substrate 599 as an example. In an alternative structure, memory device 200 can include a dielectric (e.g., a layer of dielectric material, not shown) between conductive connection 297 and substrate 599.

As shown in FIG. 5A and FIG. 5B, memory device 200 can include a semiconductor material 596 formed over conductive connection 297. Semiconductor material 596 can include a structure (e.g., a piece (e.g., a layer)) of silicon, polysilicon, or other semiconductor material, and can include a doped region (e.g., p-type doped region), or other conductive materials.

Memory device 200 can include a conductive region 597 (e.g., a common conductive plate) under memory cell 210 and under other memory cells (e.g., memory cells 211, 212, and 213 in FIG. 5C) of memory device 200. Conductive region 597 can include at least one of the materials (e.g., doped polysilicon) of semiconductor material 596 and the material (e.g., metal or doped polysilicon) of conductive connection 297. Thus, conductive region 597 can include the material of semiconductor material 596, the material of conductive connection 297, or a combination of the materials of semiconductor material 596 and conductive connection 297.

As shown in FIG. 5A and FIG. 5B, data line 271 (associated with signals BL1) can have a length in the Y-direction, a width in the X-direction, and a thickness in the Z-direction. Data line 271 can include a conductive material (or a combination of materials) that can be structured as a conductive line (e.g., conductive region). Example materials for data line 271 include metal, conductively doped polysilicon, or other conductive materials. Other data lines (e.g., data lines 272 in FIG. 2) of memory device 200 can have a similar structure as data line 271.

As shown in FIG. 5A and FIG. 5B, access lines 241R and 241W can be opposite from each other with respect to the Y-direction. Each of access lines 241R and 241W can include a conductive material (or a combination of materials) that can be structured as a conductive line (e.g., conductive region). Each of access lines 241R and 241W can include a structure (e.g., a piece (e.g., a layer)) of conductive material (e.g., metal, conductively doped polysilicon, or other conductive materials). Each access line 241R and 241W can have a length extending in the X-direction, a width (e.g., a height) in the Z-direction, and a thickness in the Y-direction.

Access line 241R and 241W are electrically separated from each other. Thus, two different signals (e.g., signals WL1R and WL1W) having different voltages can be applied (e.g., concurrently applied) to access line 241R and 241W, respectively, in a same operation (e.g., a read or write operation) of memory device 200.

Charge storage structure 202 of memory cell 210 (and other memory cells of memory device 200) can include a charge storage material (or a combination of materials), which can include a piece (e.g., a layer) of semiconductor material (e.g., polysilicon), a piece (e.g., a layer) of metal, or a piece of material (or materials) that can trap charge. The materials of access line 241R and 241W and charge storage structure 202 can be the same or can be different. As shown in FIG. 5A and FIG. 5B, charge storage structure 202 can include a portion (e.g., bottom portion) that is closer (e.g., extends in the Z-direction closer) to substrate 599 than the bottom portion of each of access line 241R and 241W.

Memory device 200 can include a material 520 located between and electrically coupled to (e.g., directly contacting) data line 271 and charge storage structure 202. As described above, charge storage structure 202 of memory cell 210 can form the memory element of memory cell 210. Thus, as shown in FIG. 5A and FIG. 5B, memory cell 210 can include a memory element (which is charge storage structure 202) located between substrate 599 and material 520 with respect to the Z-direction, in which the memory element contacts (e.g., is directly coupled to) material 520.

Material 520 can form a source (e.g., source terminal) of transistor T2, a drain (e.g., drain terminal) of transistor T2, a channel region (e.g., write channel region) between the source and the drain of transistor T2 of memory cell 210. Thus, as shown in FIG. 5A and FIG. 5B, the source, channel region, and the drain of transistor T2 of memory cell 210 can be formed from a single structure, for example, a single piece of the same material (or alternatively, a single piece of the same combination of materials), such as material 520. Therefore, the source, the drain, and the channel region of transistor T2 of memory cell 210 can be formed from the same material (e.g., material 520) of the same conductivity type (e.g., either n-type or p-type). Other memory cells of memory device 200 can also include material 520 like memory cell 210.

In the example where transistor T2 is an NFET (as described above), material 520 can include n-type semiconductor material (e.g., n-type silicon). In another example, the semiconductor material that forms material 520 can include a structure (e.g., a piece) of oxide material. Examples of the oxide material used for material 520 include semiconducting oxide materials, transparent conductive oxide materials, and other oxide materials.

As an example, material 520 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

Using the materials listed above in memory device 200 provides improvement and benefits for memory device 200. For example, during a read operation, to read information from a selected memory cell (e.g., memory cell 210), charge from charge storage structure 202 of the selected memory cell may leak to transistor T2 of the selected memory cell. Using the material listed above for the channel region (e.g., material 520) of transistor T2 can reduce or prevent such a leakage. This improves the accuracy of information read from the selected memory cell and improves the retention of information stored in the memory cells of the memory device (e.g., memory device 200) described herein.

The materials listed above are examples of material 520. However, other materials (e.g., a relatively high band-gap material) different from the above-listed materials can be used.

As shown in FIG. 5A and FIG. 5B, material 520 and charge storage structure 202 of memory cell 210 can be electrically coupled (e.g., directly coupled) to each other, such that material 520 can contact charge storage structure 202 of memory cell 210 without an intermediate material (e.g., without a conductive material) between charge storage structure 202 of memory cell 210 and material 520. In an alternative structure (not shown), material 520 can be electrically coupled to charge storage structure 202 of memory cell 210, such that material 520 is not directly coupled to (not contacting) charge storage structure 202 of memory cell 210, but material 520 is coupled to (e.g., indirectly contacting) charge storage structure 202 of memory cell 210 through an intermediate material (e.g., a conductive material) between charge storage structure 202 of memory cell 210 and material 520.

As shown in FIG. 5A and FIG. 5B, memory cell 210 can include a portion 510, which can include a structure (e.g., a piece (e.g., a layer)) of semiconductor material. Example materials for portion 510 can include silicon, polysilicon (e.g., undoped or doped polysilicon), germanium, silicon-germanium, or other semiconductor materials, and semiconducting oxide materials (oxide semiconductors. e.g., SnO, or other oxide semiconductors).

As described above with reference to FIG. 2, transistor T1 of memory cell 210 includes a channel region (e.g., read channel region). In FIG. 5A and FIG. 5B, the channel region of transistor T1 of memory cell 210 can include (e.g., can be formed from) portion 510. Portion 510 can be electrically coupled to data line 271 and conductive region 597. As described above with reference to FIG. 2, memory cell 210 can include a read path. In FIG. 5A and FIG. 5B, portion 510 (e.g., the read channel region of transistor T1) can be part of the read path of memory cell 210 that can carry a current (e.g., read current) during a read operation of reading information from memory cell 210. For example, during a read operation to read information from memory cell 210, portion 510 can conduct a current (e.g., read current) between data line 271 and conductive connection 297 (through part of semiconductor material 596). The direction of the read current can be from data line 271 to conductive region 597 (through portion 510 and part of semiconductor material 596 and part of conductive connection 297). In the example where transistor T1 is a PFET and transistor T2 is an NFET, the material that forms portion 510 can have a different conductivity type from material 520. For example, portion 510 can include p-type semiconductor material (e.g., p-type silicon) regions, and material 520 can include n-type semiconductor material (e.g., n-type gallium phosphide (GaP)) regions.

As shown in FIG. 5A and FIG. 5B, a portion of access line 241R that directly faces (e.g., directly opposes) portion 510 can form gate 251 of transistor T1 of memory cell 210. A portion of access line 241W that directly faces (e.g., directly opposes) adjacent material 520 can form gate 252 of transistor T2 of memory cell 210. Since access lines 241R and 241W are electrically separated from each other, gates 251 and 252 are also electrically separated from each other.

As shown in FIG. 5A and FIG. 5B, access line 241R extends lengthwise in the X-direction and is adjacent (e.g., directly facing) portion 510 (e.g., read channel region of transistor T1). Access line 241W is not adjacent (e.g., not directly facing) portion 510. Access line 241W extends lengthwise in the X-direction and is adjacent (e.g., directly facing) materials 520 (e.g., write channel region of transistor T2). Access line 241W is not adjacent (e.g., not directly facing) materials 510. Thus, in memory device 200, each access line is adjacent (e.g., directly facing) either portion 510 (e.g., read channel region of transistor T1) of a memory cell or material 520 (e.g., write channel region of transistor T2) of a memory cell but not both portion 510 and material 520 of a memory cell.

As shown in FIG. 5C, other memory cells (e.g., memory cells 211, 212, and 213) and access lines (e.g., access lines 242R and 242W) of memory device 200 can have structures similar to (or the same as) the structure of memory cell 210 and access line 241R and 241W. The memory cells (e.g., memory cells 210 through 214 in FIG. 5C) of memory device 200 can be formed over substrate 599 and can share conductive region 597 (which can include any combination of semiconductor material 596 and conductive connection 297). Conductive region 597 can be a common conductive region for the memory cells of memory device 200. Alternatively, conductive region 597 can be divided (e.g., patterned) into multiple portions (FIG. 5D).

As shown in FIG. 5D, memory device 200 can include conductive regions $597_0$ and $597_1$ that can collectively correspond to conductive region 597 of FIG. 5C. The memory cells coupled to the same data line in the Y-direction can share (can be electrically coupled to) the same conductive region (one of conductive regions $597_0$ and $597_1$). For example, memory cells 210 and 212 (which are coupled to data line 271) can share conductive region $597_0$. Memory cells 211 and 213 (which are coupled to data line 272) can share conductive region $597_1$.

FIG. 5D shows an example of conductive region 597 of FIG. 5C being divided (e.g., patterned) into conductive regions $597_0$ and $597_1$ that extend lengthwise in the Y-direction. However, in an alternative structure, conductive region 597 of FIG. 5C can be divided (e.g., patterned) into conductive regions that can extend lengthwise in the X-direction. In such an alternative structure, the memory cells (e.g., memory cells 210 and 211, or 212 and 214) sharing the same access line can share (can be electrically coupled to) the same conductive region.

Figure 6A:
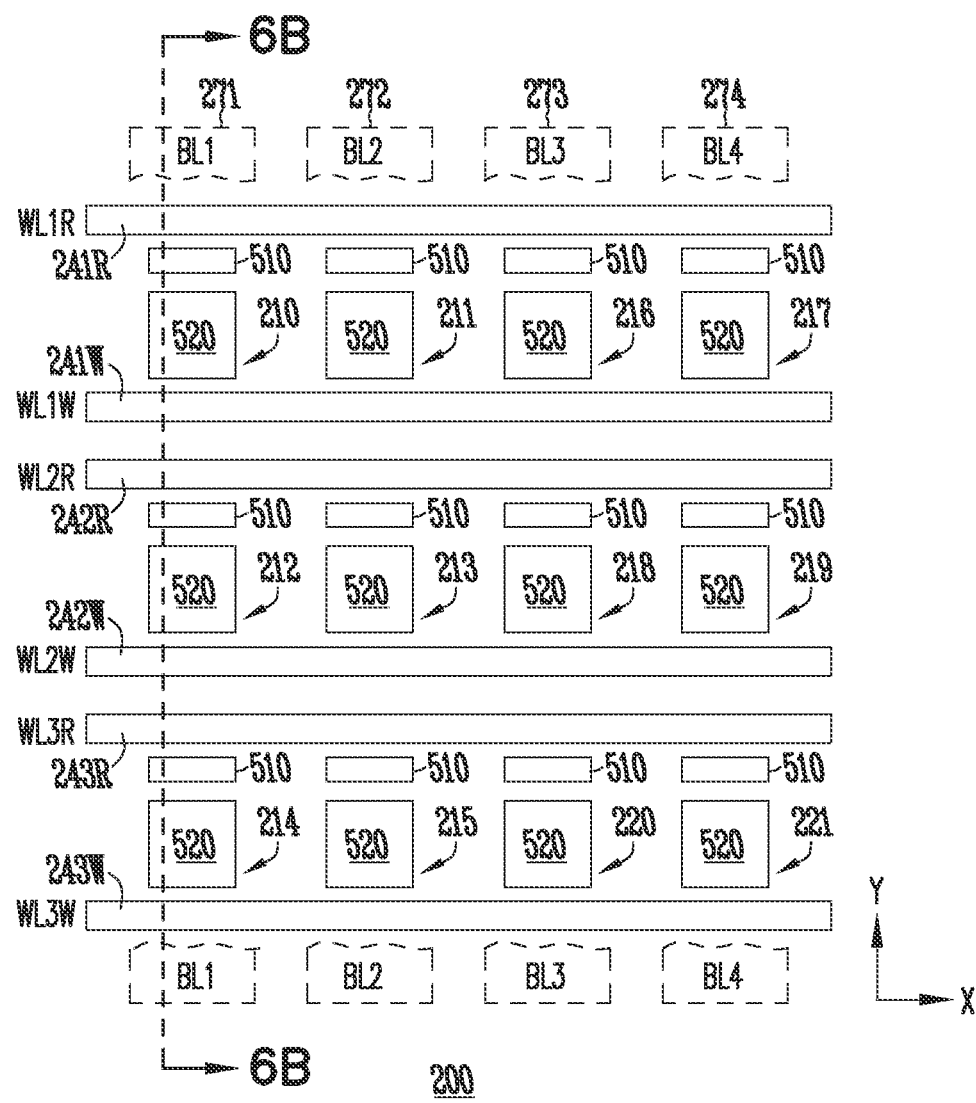
FIG. 6A and FIG. 6B show a top view and a side view, respectively, of the memory device of FIG. 5A through FIG. 5D, according to some embodiments described herein.
Figure 6B:
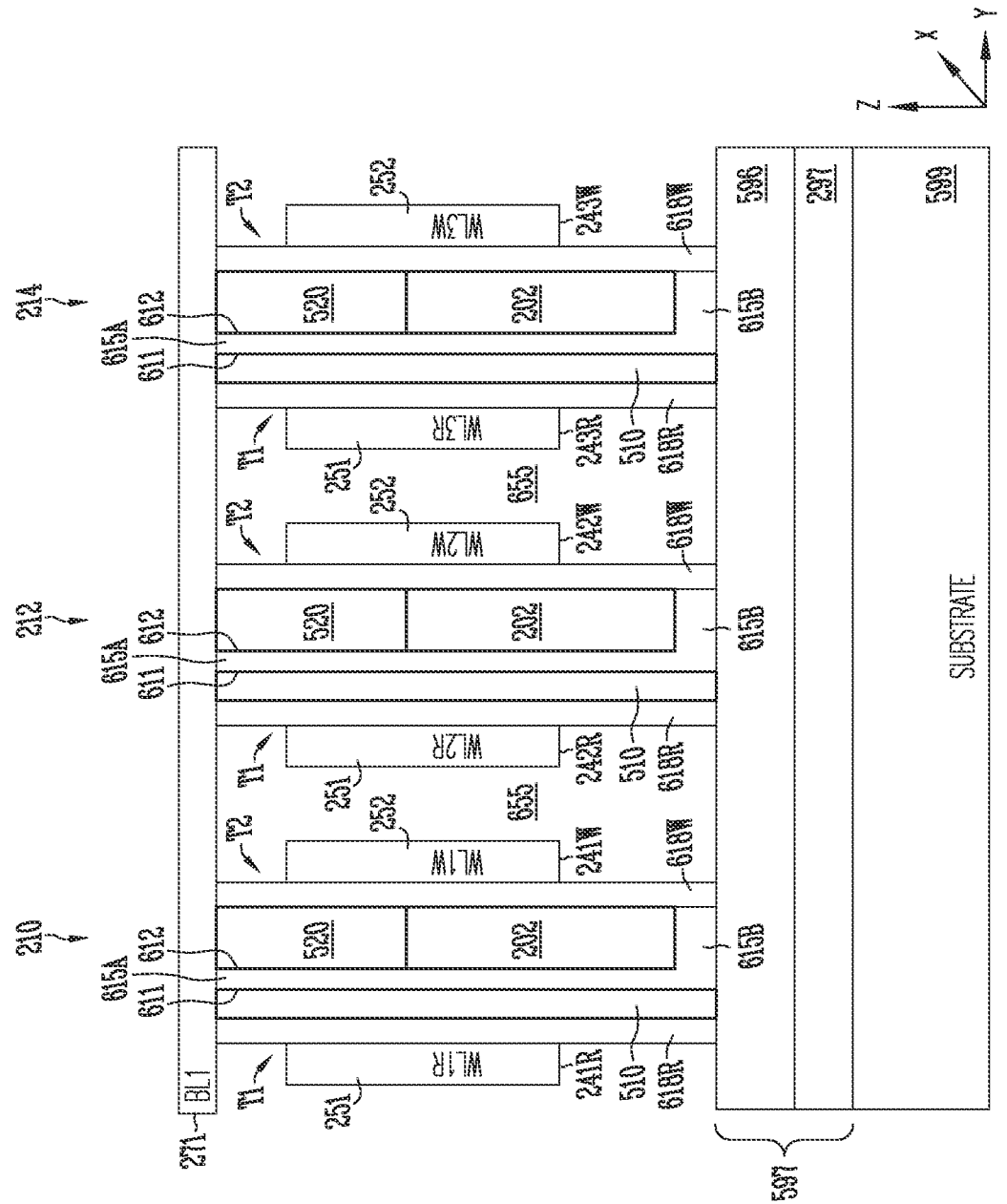

FIG. 6A shows a top view (e.g., plan view) of a portion of memory device 200, according to some embodiments described herein. FIG. 6B shows a view (e.g., cross-sectional view) taken along line 6B-6B of FIG. 6A. In FIG. 6A, it is noted that memory cells 216, 217, 218, 219, 220, and 221 and data lines 273 and 274 (and associated signals BL3 and BL4) are not shown in FIG. 2 and FIG. 5A through FIG. 5D. For simplicity, only some elements of memory device 200 are shown in FIG. 6A.

FIG. 6A shows relative locations of portions 510 (e.g., read channel regions) of transistors T1 (not labeled) and material 520 (e.g., write channel regions) of transistors T2 (not labeled) of memory cells 210 through 221, access lines 241R. 241W. 242R, 242W, 243R, and 243W, and data lines 271, 272, 273, and 274. Charge storage structures 202 (located under respective materials 520) of memory cells 210 through 221 are located under respective materials 520 and are hidden under from the top view of FIG. 6A.

As shown FIG. 6A, the memory cells (e.g., memory cells 211 through 221) of memory device 200 can be arranged in a matrix (or matrix-like) pattern. Access lines 241R. 241W, 242R. 242W, 243R, and 243W can have lengths in the X-direction and are parallel to each other. Access lines 241R, 242R, and 243R are adjacent (e.g., directly facing) respective portions 510 (e.g., read channel regions of transistors T1) of memory cells 210 through 221. Access lines 241W, 242W, and 243W are adjacent (e.g., directly facing) respective materials 520 (e.g., write channel regions of transistors T2) of memory cells 210 through 221. For simplicity, dielectric structures 618R and 618W (in FIG. 6B) between the access lines and respective portions 510 and materials 520 are not shown in FIG. 6A. As shown in FIG. 6A, access lines 241R, 241W. 242R, 242W. 243R, and 243W are perpendicular to data lines 271, 272, 273, and 274.

Data lines 271, 272, 273, and 274 (shown in dashed lines), which are located over access lines 241R. 241W, 242R. 242W, 243R, and 243W and memory cells 210 through 221, can have lengths in the Y-direction and are parallel to each other. As shown in FIG. 6A, the direction from portion 510 (e.g., read channel region) to material 520 (e.g., write channel region) of a respective memory cell among memory cells 210, 212, and 214 coupled to a particular data line (e.g., data line 271) is also the same as the direction (Y-direction) of the particular data line.

As shown in FIG. 6B, each of memory cells 210, 212, and 214 can include dielectric structures 615A and 615B. Dielectric structures 615A and 615B can be oxide regions that separate charge storage structure 202 and material 520 (e.g., write channel region) from portion 510 (e.g., read channel region) of a respective memory cell. Dielectric structures 615A and 615B can also electrically separate charge storage structure 202 of a respective memory cell from conductive region 597.

Example materials for dielectric structures 615A and 615B include silicon dioxide, hafnium oxide (e.g., $HfO_2$), aluminum oxide (e.g., $Al_2O_3$), or other dielectric materials. In an example structure of memory device 200, dielectric structures 615A and 615B include a high-k dielectric material (e.g., a dielectric material having a dielectric constant greater than the dielectric constant of silicon dioxide). Using such a high-k dielectric material (instead of silicon dioxide) can improve the performance (e.g., reduce current leakage, increase drive capability of transistor T1, or both) of memory device 200.

As shown in FIG. 6B, dielectric structure 615A has opposing sides 611 and 612 in the X-direction. Portion 510 (read channel region of transistor T1) can be located on side 611 of dielectric structure 615A. Material 520 (write channel region of transistor T2) can be located on side 612 of dielectric structure 615A.

Memory device 200 can include dielectric structures 655 between adjacent memory cells in the X-direction. Dielectric structures 655 can electrically separate adjacent access lines among the access lines (e.g., access lines 241R, 241W. 242R, 242W. 243R, and 243W) associated with respective memory cells. Dielectric structures 655 can include an oxide material (e.g., silicon dioxide).

As shown in FIG. 6B, access lines 241R and 241W can form gate 251 of transistor T1 and gate 252 of transistor T2, respectively, of memory cell 210. Access lines 242R and 242W can form gate 251 of transistor T1 and gate 252 of transistor T2, respectively, of memory cell 212. Access lines 243R and 243W can form gate 251 of transistor T1 and gate 252 of transistor T2, respectively, of memory cell 214.

As shown in FIG. 6B, in memory cell 210, gate 251 is opposite from gate 252 in the X-direction, which is a direction from the read channel region (included in portion 510) of memory cell 210 to the write channel region (included in material 520) of memory cell 210. Gates 251 and 252 of each of the other memory cells (e.g., each of memory cells 212 and 214) of memory device 200 can be located opposite from each other in the X-direction in a similar way as gates 251 and 252 of memory cell 210.

Dielectric structure 618R can be a gate oxide region that electrically separates gate 251 of transistor T1 from portion 510 (e.g., read channel region of transistor T1) of a respective memory cell. Dielectric structure 618W can be a gate oxide region that electrically separates gate 252 of transistor T2 from material 520 (e.g., write channel region of transistor T2) of a respective memory cell. The material (or materials) for dielectric structures 618R and 618W can be the same as (or alternatively, different from) the material (or materials) of dielectric structures 615A and 615B. Example materials for dielectric structures 618R and 618W include silicon dioxide, hafnium oxide (e.g., $HfO_2$), aluminum oxide (e.g., $Al_2O_3$), or other dielectric materials.

FIG. 6B shows example locations (e.g., vertical positions) of access lines 241R, 241W. 242R, 242W, 243R, and 243W with respect to Z-direction. However, the locations of access lines 241R. 241W. 242R. 242W, 243R, and 243W with respect to Z-direction can be different from those shown in FIG. 6B. For example, access lines 241R, 241W. 242R. 242W. 243R, and 243W can be positioned higher (e.g., can be moved up) in the Z-direction to be closer to data line 271 than the example locations shown in FIG. 6B. In another example, access lines 241R, 241W, 242R, 242R, and 243W can be positioned lower (e.g., can be moved down) in the Z-direction to be farther from data line 271 than the example locations shown in FIG. 6B. Further, the widths (e.g., height) in the Z-direction of access lines 241R, 241W, 242R. 242W, 243R, and 243W can be different from (e.g., less than or greater than) the widths of access lines 241R, 241W. 242R, 242W, 243R, and 243W shown in FIG. 6B.

Figure 7A:
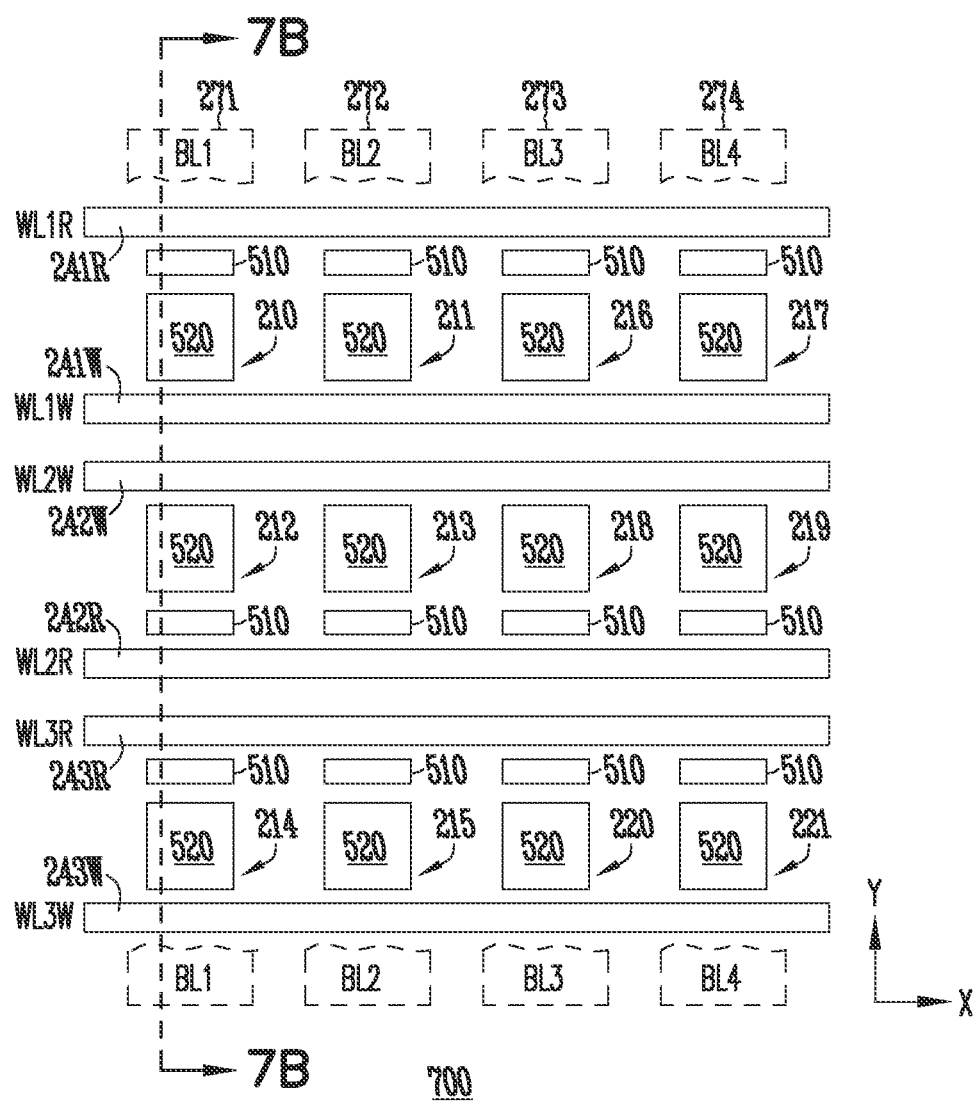
FIG. 7A and FIG. 7B show another memory device that can be a variation of the memory device shown in FIG. 6A and FIG. 6B, according to some embodiments described herein.
Figure 7B:
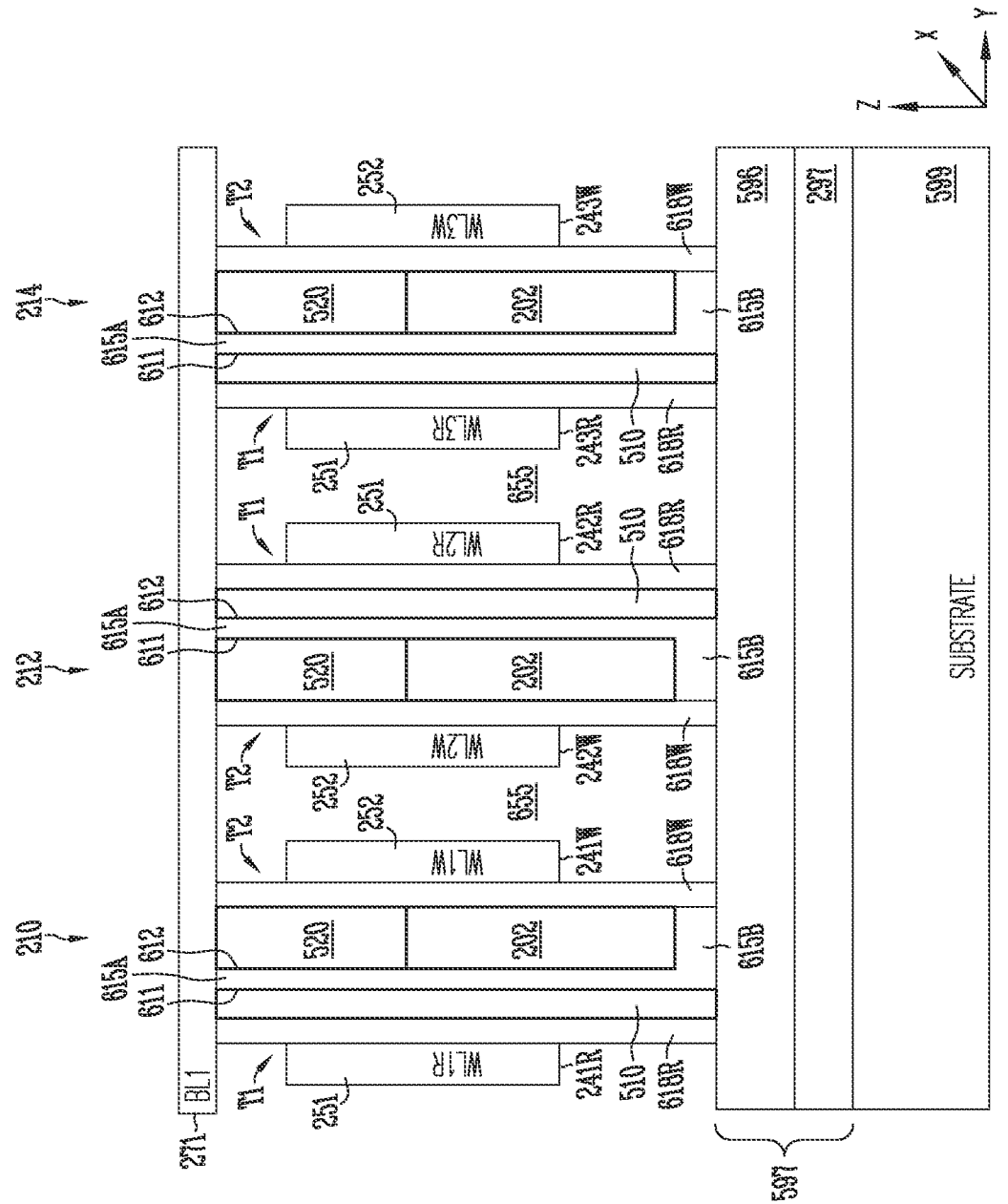

FIG. 7A shows a top view (e.g., plan view) of a portion of memory device 700, according to some embodiments described herein. FIG. 7B shows a side view (e.g., cross-sectional view) taken along line 7B-7B of FIG. 7A. Memory device 700 can be a variation of memory device 200 of FIG. 6A and FIG. 6B and can include elements similar to (or the same as) the elements of memory device 200. For simplicity, similar or the same elements between memory device 200 (FIG. 6A and FIG. 6B) and memory device 700 (FIG. 7A and FIG. 7B) are given the same labels and their descriptions are not repeated.

Differences between memory devices 200 and 700 include the arrangements of access lines 241R, 241W, 242R. 242W, 243R, and 243W and the relative locations of read and write channel regions (portions 510 and materials 520) of adjacent memory cells in the Y-direction.

In FIG. 6A and FIG. 6B described above, the access lines are arranged in a pattern of read, write, read, write access lines (e.g., access lines 241R. 241W, 242R, 242W). Thus, two adjacent access lines (e.g., access lines 241W and 242R) are different types of access lines (read access line and write access line).

In FIG. 7A and FIG. 7B, the access lines can be arranged in a pattern such that two adjacent access lines can be the same type of access lines (either read access lines or write access lines). For example, access lines 241W and 242W (adjacent accesses lines) are write access lines. In another example, access lines 242R and 243R (adjacent access lines) are read access lines.

In FIG. 7A and FIG. 7B, the channel regions of adjacent memory cells in the Y-direction can also be the same type of channel regions (e.g., either read channel regions or write channel regions). For example, memory cells 210 and 212 (adjacent memory cells in the Y-direction) have adjacent write channel regions (materials 520). In another example, memory cells 212 and 214 (adjacent memory cells in the Y-direction) have adjacent read channel regions (portions 510).

Although not shown in FIG. 7A and FIG. 7B, memory device 700 can have separate drivers to separately drive respective access lines 241R. 241W, 242R, 242W, 243R, and 243W like memory device 200.

The structures and operations of memory devices 200 and 700 described above provide improvements and benefits in the described memory devices in comparison with some conventional memory devices. For example, as described above, memory device 200 includes separate access lines (e.g., access line 241R and 241W) that form separate gates (e.g., gates 251 and 252) to control transistors T1 and T2, respectively, of a memory cell (e.g., memory cell 210 or 211). Since transistor T2 is controlled by a separate gate (e.g., gate 252), the threshold voltage of transistor T2 may not need to be relatively high (to avoid read disturbance of the memory cell) when transistor T1 is turned on (using gate 251) in a read operation. Thus, in comparison with a conventional device that uses the same access line to control multiple access transistors in a memory cell, the requirements associated with having a relatively higher threshold voltage for transistor T2 in memory device 200 can be lessened. This can allow more options for forming the structure and selection of the material (e.g., material 520) of transistor T2, leading to improving read and write operation of memory device 200.

Some conventional memory devices may use multiple data lines to access a selected memory cell (e.g., during a read operation) to read information from the selected memory cell. In memory device 200, a single data line (e.g., data line 271 or 272 in FIG. 2 and FIG. 3) can be used to access a selected memory cell (e.g., during a read operation) to read information from the selected memory cell. This may also simplify the structure, operation, or both of memory device 200 in comparison with conventional memory devices that use multiple data lines to access a selected memory cell.

Further, the arrangement of the access lines described herein can provide built-in shield structures that can protect or prevent adjacent transistors from disturbance (e.g., channel region to channel region disturbance) during read and write operations of adjacent memory cells. For example, as shown in FIG. 6B, access line 242R can be a shield structure that shields access line 241W from disturbance during a write operation performed on memory cell 212 (when access line 242W is used to access transistor T2 of memory cell 212). In another example, as shown in FIG. 6B, access line 241W can be a shield structure that shields access line 242R from disturbance during a read operation performed on memory cell 210 (when access line 241R is used to access transistor T1 of memory cell 210).

Moreover, the arrangement of the access lines described herein (e.g., in FIG. 5C) allows an option for the size (e.g., the area) of elements of the memory cell, including charge storage structure 202, portion 510 (e.g., read channel region), and material 520 (e.g., write channel region), to be proportionally increased in the same direction (e.g., the X-direction). This size increase can improve (e.g., increase) storage capacitance of the memory cell.

Figure 8A:
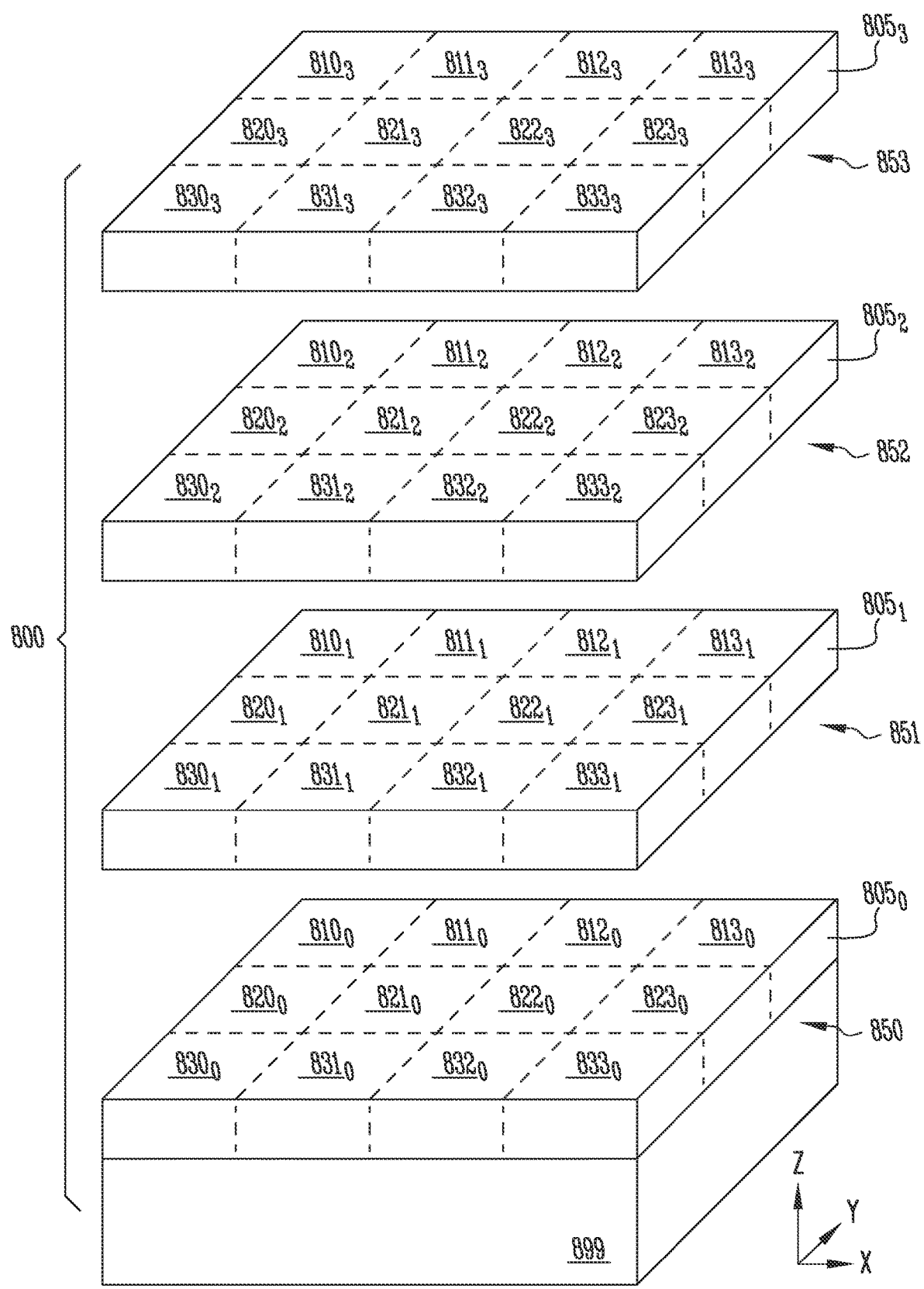
FIG. 8A, FIG. 8B, and FIG. 8C show different views of a structure of a memory device including multiple decks of memory cells, according to some embodiments described herein.
Figure 8B:
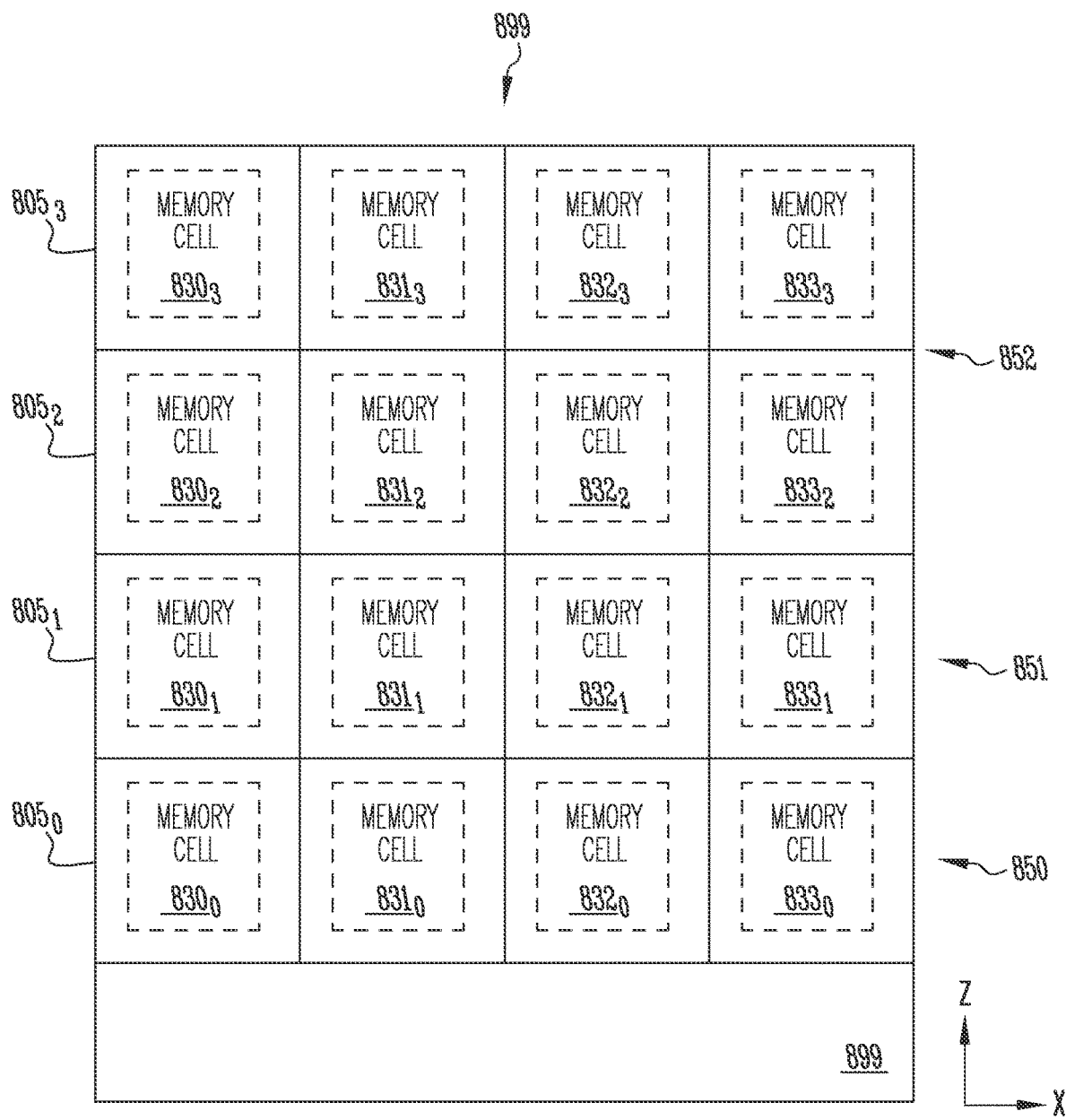
Figure 8C:
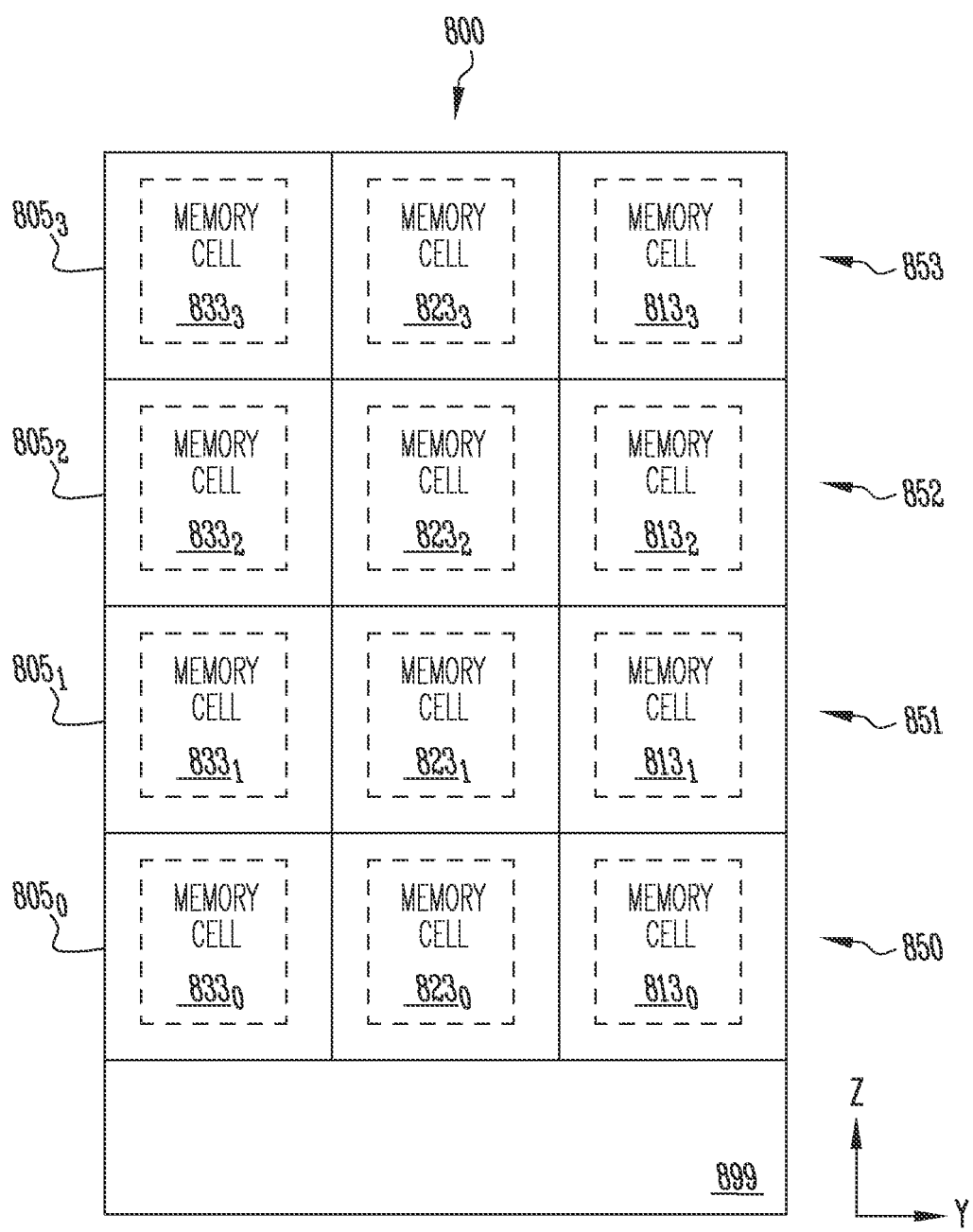

FIG. 8A, FIG. 8B, and FIG. 8C show different views of a structure of a memory device 800 including multiple decks of memory cells, according to some embodiments described herein. FIG. 8A shows an exploded view (e.g., in the Z-direction) of memory device 800. FIG. 8B shows a side view (e.g., cross-sectional view) in the X-direction and the Z-direction of memory device 800. FIG. 8C shows a side view (e.g., cross-sectional view) in the Y-direction and the Z-direction of memory device 800.

As shown in FIG. 8A, memory device 800 can include decks (decks of memory cells) $805_0$, $805_1$, $805_2$, and $805_3$ that are shown separately from each other in an exploded view to help ease of viewing the deck structure of memory device 800. In reality, decks $805_0$, $805_1$, $805_2$, and $805_3$ can be attached to each other in an arrangement where one deck can be formed (e.g., stacked) over another deck over a substrate (e.g., a semiconductor (e.g., silicon) substrate) 899. For example, as shown in FIG. 8A, decks $805_0$, $805_1$, $805_2$, and $805_3$ can be formed in the Z-direction perpendicular to substrate 899 (e.g., formed vertically in the Z-direction with respect to substrate 899).

As shown in FIG. 8A, each of decks $805_0$, $805_1$, $805_2$, and $805_3$ can have memory cells arranged in the X-direction and the Y-direction (e.g., arranged in a matrix-like pattern with rows in the X-direction and in columns in the Y-direction). For example, deck $805_0$ can include memory cells $810_0$, $811_0$, $812_0$, and $813_0$ (e.g., arranged in a row), memory cells $820_0$, $821_0$, $822_0$, and $823_0$ (e.g., arranged in a row), and memory cells $830_0$, $831_0$, $832_0$, and $833_0$ (e.g., arranged in a row).

Deck $805_1$ can include memory cells $810_1$, $811_1$, $812_1$, and $813_1$ (e.g., arranged in a row), memory cells $820_1$, $821_1$, $822_1$, and $823_1$ (e.g., arranged in a row), and memory cells $830_1$, $831_1$, $832_1$, and $833_1$ (e.g., arranged in a row).

Deck $805_2$ can include memory cells $810_2$, $811_2$, $812_2$, and $813_2$ (e.g., arranged in a row), memory cells $820_2$, $821_2$, $822_2$, and $823_2$ (e.g., arranged in a row), and memory cells $830_2$, $831_2$, $832_2$, and $833_2$ (e.g., arranged in a row).

Deck $805_3$ can include memory cells $810_3$, $811_3$, $812_3$, and $813_3$ (e.g., arranged in a row), memory cells $820_3$, $821_3$, $822_3$, and $823_3$ (e.g., arranged in a row), and memory cells $830_3$, $831_3$, $832_3$, and $833_3$ (e.g., arranged in a row).

As shown in FIG. 8A, decks $805_0$, $805_1$, $805_2$, and $805_3$ can be located (e.g., formed vertically in the Z-direction) on levels (e.g., portions) 850, 851, 852, and 853, respectively, of memory device 800. The arrangement of decks $805_0$, $805_1$, $805_2$, and $805_3$ forms a 3-dimensional (3-D) structure of memory cells of memory device 800 in that different levels of the memory cells of memory device 800 can be located (e.g., formed) in different levels (e.g., different vertical portions) 850, 851, 852, and 853 of memory device 800.

Decks $805_0$, $805_1$, $805_2$, and $805_3$ can be formed one deck at a time. For example, decks $805_0$, $805_1$, $805_2$, and $805_3$ can be formed sequentially in the order of decks $805_0$, $805_1$, $805_2$, and $805_3$ (e.g., deck $805_1$ is formed first and deck $805_3$ is formed last). In this example, the memory cells of one deck (e.g., deck $805_1$) can be formed either after formation of the memory cells of another deck (e.g., deck $805_0$) or before formation of the memory cells of another deck (e.g., deck $805_2$). Alternatively, decks $805_0$, $805_1$, $805_2$, and $805_3$ can be formed concurrently (e.g., simultaneously), such that the memory cells of decks $805_0$, $805_1$, $805_2$, and $805_3$ can be concurrently formed. For example, the memory cells in levels 850, 851, 852, and 853 of memory device 800 can be concurrently formed.

The structures of decks $805_0$, $805_1$, $805_2$, and $805_3$ can include the structures of memory devices 200 and 700 described above with reference to FIG. 1 through FIG. 7B. For example, the structures of the memory cells of decks $805_0$, $805_1$, $805_2$, and $805_3$ can include the structure of the memory cells, access lines, and data lines described above with reference to FIG. 1 through FIG. 7B.

Memory device 800 can include data lines (e.g., bit lines) and access lines (e.g., word lines) to access the memory cells of decks $805_0$, $805_1$, $805_2$, and $805_3$. For simplicity, data lines and access lines of memory cells are omitted from FIG. 8A. However, the data lines and access lines of memory device 800 can be similar to the data lines and access lines, respectively, of the memory devices described above with reference to FIG. 1 through FIG. 7B.

FIG. 8A shows memory device 800 including four decks (e.g., $805_0$, $805_1$, $805_2$, and $805_3$) as an example. However, the number of decks can be different from four. FIG. 8A shows each of decks $805_0$, $805_1$, $805_2$, and $805_3$ including one level (e.g., layer) of memory cells as an example. However, at least one of the decks (e.g., one or more of decks $805_0$, $805_1$, $805_2$, and $805_3$) can have two (or more) levels of memory cells. FIG. 8A shows an example where each of decks $805_0$, $805_1$, $805_2$, and $805_3$ includes four memory cells (e.g., in a row) in the X-direction and three memory cells (e.g., in a column) in the Y-direction. However, the number of memory cells in a row, in a column, or both, can vary. Since memory device 800 can include the structures of memory devices 200 and 700, memory device 800 can also have improvements and benefits like memory devices 200 and 700.

The illustrations of apparatuses (e.g., memory devices 100, 200, 700, and 800) and methods (e.g., operations of memory devices 100 and 200) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 700, and 800) or a system (e.g., an electronic item that can include any of memory devices 100, 200, 700, and 800).

Any of the components described above with reference to FIG. 1 through FIG. 8C can be implemented in a number of ways, including simulation via software. Thus, apparatuses (e.g., memory devices 100, 200, 700, and 800) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, 700, and 800) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group. Audio Layer 3) players), vehicles, medical devices (e.g., heart monitor, blood pressure monitor, etc.), set top boxes, and others.

The embodiments described above with reference to FIG. 1 through FIG. 8C include apparatuses and methods of operating the apparatuses. One of such apparatuses includes a data line, a conductive region, and a memory cell including a first transistor and a second transistor. The first transistor includes a first channel region coupled to the data line and the conductive region, a charge storage structure, and a first gate. The second transistor includes a second channel region coupled to the data line and the charge storage structure, and a second gate. The first gate is electrically separated from the second gate and opposite from the second gate in a direction from the first channel region to the second channel region. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A. B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A. B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   a data line;
   a conductive region;
   a first transistor included in a memory cell, the first transistor including a first channel region coupled to the data line and the conductive region, a charge storage structure, and a first gate; and
   a second transistor included in the memory cell, the second transistor including a second channel region coupled to the data line and the charge storage structure, and a second gate, wherein the first gate is electrically separated from the second gate, and the first gate is opposite from the second gate in a direction from the first channel region to the second channel region, wherein the first and second channel regions have different materials.

2. The apparatus of claim 1, wherein the second channel region includes a semiconducting oxide material.

3. The apparatus of claim 2, wherein the first channel region includes conductively doped polysilicon.

4. An apparatus comprising:
   a data line;
   a conductive region;
   a first transistor included in a memory cell, the first transistor including a first channel region coupled to the data line and the conductive region, a charge storage structure, and a first gate; and
   a second transistor included in the memory cell, the second transistor including a second channel region coupled to the data line and the charge storage structure, and a second gate, wherein the first gate is electrically separated from the second gate, and the first gate is opposite from the second gate in a direction from the first channel region to the second channel region, wherein the data line has a length in the direction from the first channel region to the second channel region.

5. The apparatus of claim 1, wherein the conductive region includes metal.

6. The apparatus of claim 4, wherein the conductive region includes a ground connection.

7. The apparatus of claim 1, wherein the first second channel region includes at least one of zinc tin oxide (ZTO), indium zinc oxide (IZO), zinc oxide (ZnO$_x$), indium gallium zinc oxide (IGZO), indium gallium silicon oxide (IGSO), indium oxide (InO$_x$, In$_2$O$_3$), tin oxide (SnO$_2$), titanium oxide (TiOx), zinc oxide nitride (Zn$_x$O$_y$N$_z$), magnesium zinc oxide (Mg$_x$Zn$_y$O$_z$), indium zinc oxide (In$_x$Zn$_y$O$_z$), indium gallium zinc oxide (In$_x$Ga$_y$Zn$_z$O$_a$), zirconium indium zinc oxide (Zr$_x$In$_y$Zn$_z$O$_a$), hafnium indium zinc oxide (Hf$_x$In$_y$Zn$_z$O$_a$), tin indium zinc oxide (Sn$_x$In$_y$Zn$_z$O$_a$), aluminum tin indium zinc oxide (Al$_x$Sn$_y$In$_z$Zn$_a$O$_d$), silicon indium zinc oxide (Si$_x$In$_y$Zn$_z$O$_a$), zinc tin oxide (Zn$_x$Sn$_y$O$_z$), aluminum zinc tin oxide (Al$_x$Zn$_y$Sn$_z$O$_a$), gallium zinc tin oxide (Ga$_x$Zn$_y$Sn$_z$O$_a$), zirconium zinc tin oxide (Zr$_x$Zn$_y$Sn$_z$O$_a$), indium gallium silicon oxide (InGaSiO), and gallium phosphide (GaP).

8. An apparatus comprising:
a data line having length in a first direction;
a first memory cell including:
a first transistor including a first channel region coupled to the data line, and a first charge storage structure;
a second transistor including a second channel region coupled to the data line and the first charge storage structure; and
a first dielectric structure having a first side, and a second side opposite from the first side in the first direction, wherein the first channel region is located on the first side of the first dielectric structure, and the second channel region is located on the second side of the first dielectric structure;
a second memory cell including:
a third transistor including a third channel region coupled to the data line, and a second charge storage structure;
a fourth transistor including a fourth channel region coupled to the data line and the second charge storage structure; and
a second dielectric structure having a first side, and a second side opposite from the first side in the first direction, wherein the third channel region is located on the first side of the second dielectric structure, and the fourth channel region is located on the second side of the second dielectric structure;
a first conductive line forming a first gate of the first transistor;
a second conductive line forming a second gate of the second transistor;
a third conductive line forming a third gate of the third transistor; and
a fourth conductive line forming a fourth gate of the fourth transistor, wherein each of the first, second, third, and fourth conductive lines has a length in a second direction.

9. The apparatus of claim 8, wherein the first and third channel regions are formed from a first material different from a second material of the second and fourth channel regions.

10. The apparatus of claim 8, wherein the first and third channel regions are formed from a conductively doped polysilicon, and the second and fourth channel regions are formed from a semiconducting oxide material.

11. The apparatus of claim 8, further comprising a conductive region coupled to the first and third channel regions, wherein each of the first and third channel regions has a length extending in a direction between the data line and the conductive region.

12. The apparatus of claim 8, wherein the first direction and the second direction are perpendicular to each other.

13. The apparatus of claim 8, wherein the second and third gates are between the first and fourth gates.

14. The apparatus of claim 8, wherein the second and fourth gates are between the first and third gates.

15. An apparatus comprising:
a data line;
a conductive region;
a first transistor included in a memory cell, the first transistor including a first channel region coupled to the data line and the conductive region, a charge storage structure, a first dielectric portion between the first charge storage structure and the first channel region, and a first gate; and
a second transistor included in the memory cell, the second transistor including a second channel region coupled to the data line and the charge storage structure, a second dielectric portion between the charge storage structure and the conductive region, and a second gate, wherein the first gate is electrically separated from the second gate, and the first gate is opposite from the second gate in a direction from the first channel region to the second channel region.

16. The apparatus of claim 15, wherein the first and second channel regions have different materials.

17. The apparatus of claim 16, wherein the second first channel region includes conductively doped polysilicon.

18. The apparatus of claim 15, wherein the second channel region includes a semiconducting oxide material.

* * * * *